United States Patent [19]

Van Praet et al.

[11] Patent Number: 5,854,929

[45] Date of Patent: Dec. 29, 1998

[54] METHOD OF GENERATING CODE FOR PROGRAMMABLE PROCESSORS, CODE GENERATOR AND APPLICATION THEREOF

[75] Inventors: Johan Roland Van Praet, Wemmel; Dirk Lanneer, Landen; Werner Gustaaf Theresia Geurts, Rijkevorsel; Gert Lodewijk Huibrecht Goossens, Leuven, all of Belgium

[73] Assignee: Interuniversitair Micro-Elektronica Centrum (IMEC vzw), Belgium

[21] Appl. No.: 751,337

[22] Filed: Nov. 18, 1996

[30] Foreign Application Priority Data

Mar. 8, 1996 [EP] European Pat. Off. .......... 96 870 0302

[51] Int. Cl.⁶ ..................................... G06F 3/00
[52] U.S. Cl. .................. 395/705; 395/701; 395/702; 395/704; 395/564; 395/567; 395/568; 395/500; 364/578; 364/488; 364/489; 364/490; 364/491
[58] Field of Search ................................ 395/701–709, 395/564–568, 800.01, 800.02, 800.07, 800.1, 800.11, 800.16, 800; 364/48–491, 578

[56] References Cited

U.S. PATENT DOCUMENTS

| 5,163,016 | 11/1992 | Har'El et al. | 364/578 |
|---|---|---|---|
| 5,168,441 | 12/1992 | Onarheim et al. | 395/500 |
| 5,513,122 | 4/1996 | Chang et al. | 364/489 |
| 5,522,063 | 5/1996 | Ashar et al. | 395/500 |
| 5,568,396 | 10/1996 | Bamji et al. | 364/491 |
| 5,568,636 | 10/1996 | Koford | 395/500 |

OTHER PUBLICATIONS

C.G. Bell and A. Newell, *Computer Structures: Readings and Examples*, McGraw–Hill, New York, 1971, pp. 30–33.

R. Steven Glanville, et al., "A New Method for Complier Code Generation," *Proceedings of the 5th Annual ACM Symposium on Principals of Programming Languages*, 1978, pp. 231–240.

David Landskov, et al., "Local Microcode Compaction Techniques," *Computing Surveys*, vol. 12, No. 3, Sep. 1980, pp. 261–294.

Robert A. Mueller, et al., "Flow Graph Machine Models in Microcode Synthesis," *16th Annual Microprogramming Workshop (Micro 16)*, ACM, 1983, pp. 159–167.

Alfred V. Aho, et al., "Code Generation Using Tree Matching and Dynamic Processing," *ACM Transactions on Programming Languages and Systems*, vol. 11, No. 4, Oct. 1986, pp. 491–516.

Lothar Nowak, et al., "Verification of Hardware Descriptions by Retargetable Code Generation," *26th ACM/IEEE Design Automation Conference*, Paper 28.2, 1989, pp. 441–447.

Jack W. Davidson, et al., "The Design and Application of a Retargetable Peephole Optimizer," *ACM Transactions on Programming Languages and Systems*, vol. 2, No. 2, Apr. 1990, pp. 191–202.

(List continued on next page.)

*Primary Examiner*—James P. Trammell
*Assistant Examiner*—Cuong H. Nguyen
*Attorney, Agent, or Firm*—Knobbe, Martens, Olson & Bear, LLP

[57] ABSTRACT

The present invention concerns a method of generating code for a programmable processor and comprises several steps. The first step is representing the processor as a directed bipartite graph with first and second sets of vertices and with edges, the graph comprising essentially all information about an instruction set and hardware of the processor, the first set of vertices representing storage elements in the processor, and the second set of vertices representing operations in the processor. The second step includes linking the graph to tools and libraries required for generating code for the processor. The last step is executing the required code generation phases, whereby the required information about the processor is extracted from the graph. The present invention also concerns the application of this method.

44 Claims, 22 Drawing Sheets

OTHER PUBLICATIONS

David Gordan Bradlee, "Marion Code Generation Construction System," Chapter 3 of Ph.D. Thesis: *Retargetable Instruction Scheduling for Pipelined Processor*, University of Washington, 1991, pp. 13–24.

A. Fauth, et al., "Automated Generation of DSP Program Development Tools Using A Machine Language Description Formalism," *Proceedings of IEEE, ICASSP '93*, IEEE, Minneapolis, 1993, four pages.

Johan Van Praet, et al., "Instruction Set Definition and Instruction Selection for ASIPs," *Symposium on High Level Synthesis*, Ontario, Canada, May 18–20, 1994, pp. 11–16.

Pierre G. Paulin, et al., "DSP Design Tool Requirements for Embedded Systems: A Telecommunications Industrial Perspective," *Journal of VLSI Signal Processing*, vol. 9, 1995, pp. 23–47.

A. Fauth, et al., "Describing Instruction Set Processors Using nML," *Proceedings of European Design & Test Conference '95*, Paris, France, Mar. 6–9, 1995, five pages.

| 0 | arithmetic | | | | indirect move | | | | | | | | | |
|---|---|---|---|---|---|---|---|---|---|---|---|---|---|---|
| | 1:2 | 3:4 | 5:6 | 7 | 8 | 9 | 10 | 11 | 12 | 13 | 14 | 15 | 16 | 17 |
| | alu operation | | | | 1 parallel move | | | | | | | | | |
| | 00 | +,-,&,I | opd1 | opd2 | load, store | | source or destination register | | | agu +,- | address register | | index register | |
| | alu shift operation | | | | | | | | | | | | | |
| | 01 | +,- | >>,<< opd1 | opd2 | 2 parallel moves | | | | | | | | | |
| | macc operation | | | | 2 loads, load // store | | source or destination register | | agu 1 +,- | address + index register 1 | | agu 2 +,- | address + index register 2 | |
| | 10 | *,+,-,*,+ | opd1 | opd2 | | | | | | | | | | |
| | shift immediate | | | | | | | | | | | | | |
| | 11 | opd | | imm. val. | | | | | | | | | | |

| 10 | data moves with direct addressing |
|---|---|

| 11 | control flow instructions |
|---|---|

FIG.2

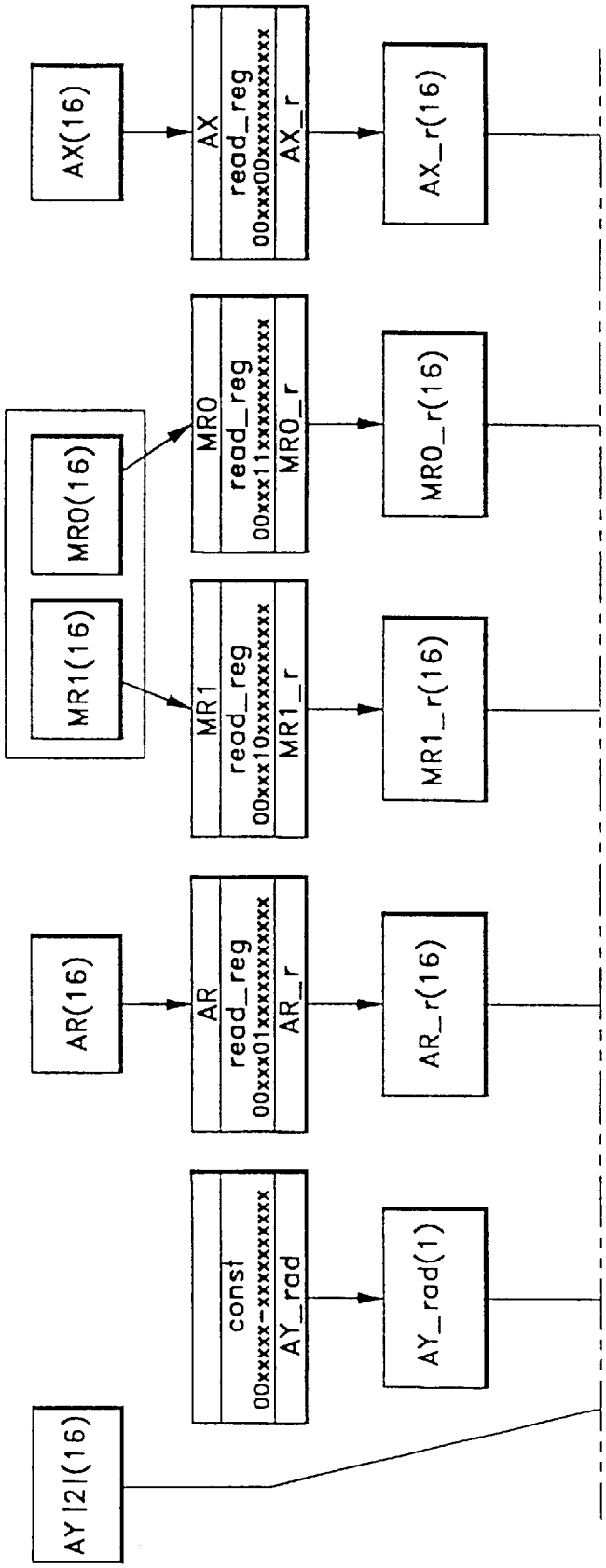

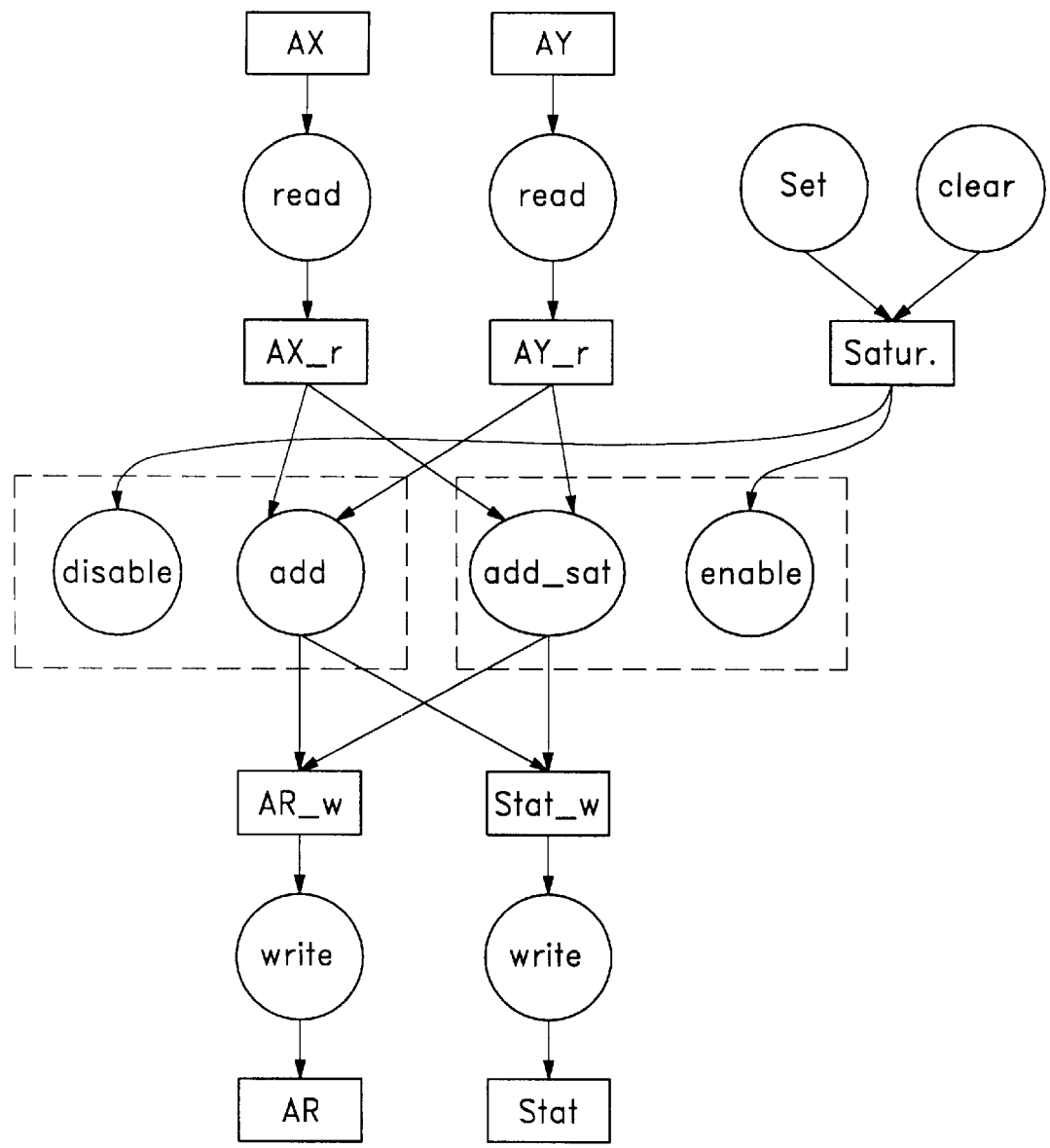
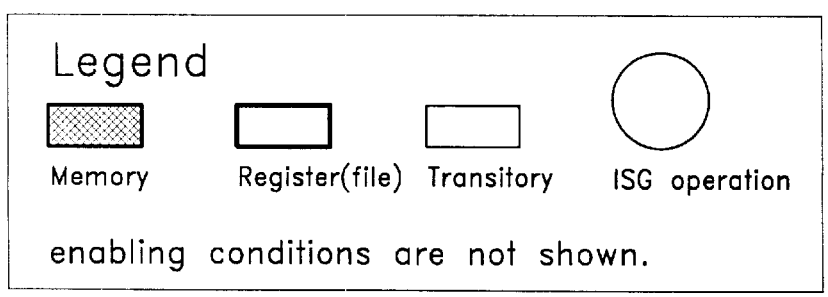
FIG. 9a

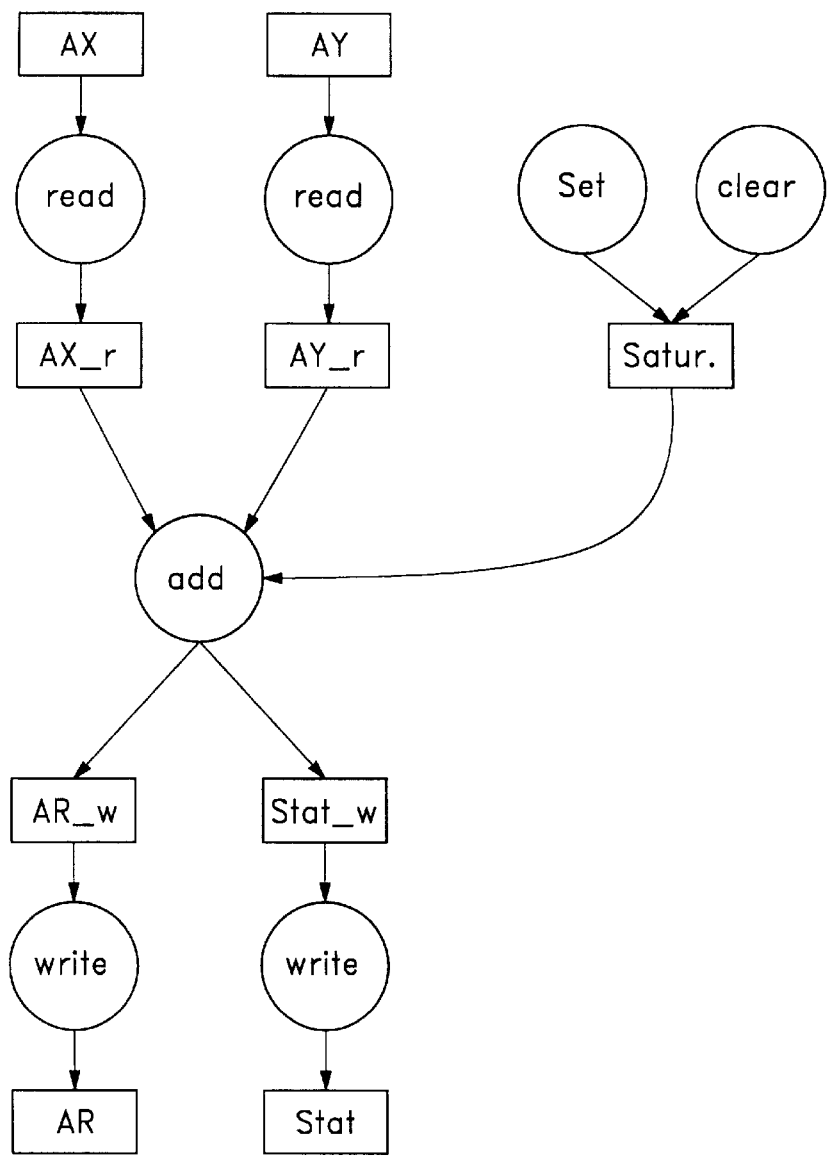
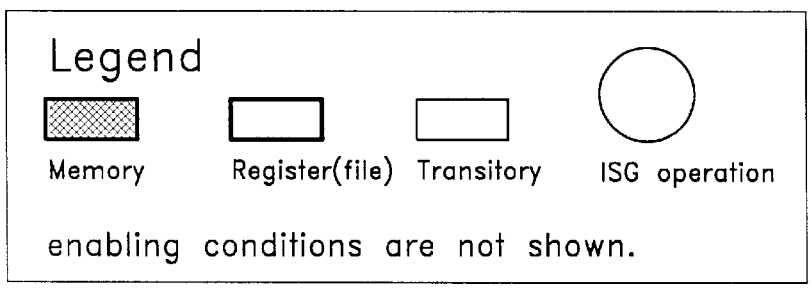
FIG. 9b

METHOD OF GENERATING CODE FOR PROGRAMMABLE PROCESSORS, CODE GENERATOR AND APPLICATION THEREOF

RELATED APPLICATIONS

This application takes priority from U.S. Ser. No. 08/441,332, filed on May 15, 1995, and from European patent application EP 96 870 030.2, filed on Mar. 8, 1996.

BACKGROUND OF THE INVENTION

1. Field of Invention

The present invention relates to computer compilers. More particularly, the invention relates to a compiler that incorporates a code generator to generate code for programmable processors and wherein a graph based representation of said programmable processors is included.

2. Description of the Related Technology

Designers of electronic systems, as for example, consumer electronics, communication systems and multimedia related electronic systems, more and more incorporate a programmable processor in said systems. Programmability offers the possibility of a cost-effective hardware reuse and the flexibility to support last minute specification changes or to add new features to said systems.

A code generator and an instruction set simulator are the key tools to aid the designer in designing the programmable processors of said systems and in developing the software to program said processors. The effort to develop said tools should be as small as possible. Ideally, these tools should be reusable for every new programmable processor without modification. Therefore, they should be retargetable. A retargetable code generator has the extra advantage that late instruction-set changes are supported. It also aids in the design of the programmable processors by providing quality measures (code size, execution time, resource utilization, and the like) on the mapping of applications to different hardware variations.

Code generators have different specific tasks to fulfill of which the most important ones are code selection, register allocation and scheduling. Each of these tasks is implemented in a different program called a code generator phase which works on a different view of the processor. Processor models for existing code generators are just a set of these different views.

It is to be noted that the requirements of programmability, low cost and low power have resulted in a new class of application specific instruction set processors (ASIPs). These are a hybrid form of custom architectures and standard processors, offering an instruction set and hardware implementation which are optimized for a small number of applications. Because of the small number of applications to be mapped on an ASIP, it is of importance to have retargetable code generators for this class of programmable processors.

In the following paragraphs prior art processor models and descriptions that are used in code generation and in retargetable code generation for different types of processors are reviewed.

The first retargetable code generators were designed for complex instruction set computers (CISCs). The architecture of these computers contains instructions with complicated operation patterns. Code selection was the most important task in these code generators and it performed register allocation and scheduling as a by-product. Code selection was implemented as tree pattern matching. As a consequence, the processor descriptions were tree or string grammars in which the production rules directly model the operation patterns available in the instruction set (Glanville and Graham, "A new method for compiler code generation", *Proc. 5th Ann. ACM SYMP. on Princ. of Pros. Lang.*, pages 231–240, 1978; Aho and Tjiang, "Code-generation using tree matching and dynamic programming", *ACM Trans. on Prog. Languages and Systems*, Vol. 11, No. 4, pages 491–516, 1989). Some descriptions were more complicated and contained matching preconditions related to hardware peculiarities, data types, storage locations and addressing modes.

In other approaches, a machine description is an enumeration of all instructions along with their corresponding simple register transfers. Also, the application is transformed in these register transfers. Code selection is performed by combining register transfers in the application into groups to be performed by one instruction (Davidson and Fraser, "The design and application of a retargetable peephole optimizer", *ACM Trans. on Prog. Languages and Systems*, Vol. 2, No. 2, pages 191–202, 1980).

More recent code generators have been developed for reduced instruction set computers (RISCs). In this case, the register allocation and scheduling tasks are more important than code selection and also need their specific information. For example, the processor description of the Marion retargetable code generator for RISCs (Bradlee, "Retargetable instruction scheduling for pipelined processors", Ph.D thesis at the University of Washington, 1991) contains a declaration of storage elements and other resources in addition to the instruction set enumeration. The register transfers are then annotated with scheduling and resource utilization information.

Recent retargetable code generators for ASIPs (Paulin, et al., "DSP tool requirements for embedded systems: a telecommunications industrial perspective", *J. VLSI Signal Processing*, Vol. 9, No. 1, 1995; Fauth and Knoll, "Automated generation of DSP program development tools using a machine description formalism", *Proc. IEEE of ICASSP 93*, Minneapolis, 1993) also use different views of a processor. Retargeting the above mentioned code generators to a new processor involves rewriting all the code generator phase specific views of the processor. This is a large effort especially because all views must be kept consistent. To solve this problem, some (e.g. Fauth and Knoll) try to derive the models from one processor description language (nML). This approach needs an analysis program for each model which is still a lot of work to implement.

In code generators of prior art, the code generator phases use different models each containing a different view of the processor. This makes it difficult to have them work closely together.

A. Fauth, et al. furthermore teach in "Describing instruction set processors using nML", *Proc. European Design Test Conference*, Paris, France, 1995, the use of the nML formalism to describe processors in terms of their instruction set. Situated at the level of description that is found in programmer's manuals, nML allows for concise specifications of programmable instruction set processors.

Some retargetable code generators already introduced a graph processor model. These graph models however do not contain sufficient information for all phases in a code generator. Mueller (Mueller and Varghese, "Flow graph machine models in microcode synthesis", *Proc. 6th Ann. Workshop on Microprog.*, pages 159–167, 1983) used a graph model for performing the task of code selection by symbolic execution. For the processors he targeted, a by-product of this code selection was register allocation. Scheduling was performed separately using a different view of the processor. Nowak (Nowak and Marwedel, "Verification of hardware descriptions by retargetable code generation", 26th ACM/IEEE Design Automation Conference 1989) extracts a so-called connection-operation graph from a structural processor description. The description is a detailed netlist of the processor including the controller and the instruction decoder, but this is often not available to the software developer. The connection-operation graph maps all conflicts on the instruction word and does not support additional checks for hardware conflicts. As a consequence, bus conflicts must be treated separately. The model only supports single-cycle operations.

SUMMARY OF THE INVENTION

One aspect of the present invention is to disclose a method for generating code on a programmable processor using a graph based instruction set processor representation which models a processor with essentially all peculiarities of the architecture and the instruction set. The model, a directed bipartite graph, can be used in all code generator phases and thus eliminates the need for different phase specific machine descriptions such as, for example, an exhaustive enumeration of operation patterns for code selection or a listing of register classes for register allocation. All code generation phases find the information they need in the model without any analysis. The model can also be used in an instruction set simulator. This method based on a directed bipartite graph model is not only applicable to ASIPs but also to general purpose processors.

Phases in a code generator cooperate better when working on one global and complete model of the processor because of better consistency, verifiability and efficiency. A processor model for retargetable code generation and instruction simulation must contain all information about the processor needed to generate correct efficient code and to simulate the content of every storage element during program execution in an instruction cycle accurate way. It must allow code generation phases to find out what operations and storage elements are available in the instruction set and how they are interconnected. Code generation and simulation programs must also be able to access information about all possible conflicts in a processor such as encoding restrictions and hardware conflicts. In short, the model must support efficient searches for valid patterns that translate into valid register transfers on the processor (which are enabled by a partial instruction). Also the timing and behavior of operations must be easily accessible.

The processor model should not, however, contain unnecessary details nor predicates to guide the code generator phases or the simulator. Not needed are, for example, the details of the decoding tables, precise timing on the sub-phases of the clock and exact modelling of hardware of which the behavior does not introduce any conflicts.

If the required information for executing the code generation phases and for simulating the execution of code is contained in the processor model, retargeting the code generator or simulator consists of providing the generator or the simulator with a new processor model. If the model is sufficiently abstract (i.e., it does not contain phase-specific information), this is a relatively small effort.

The processor model, a directed bipartite graph, advantageously can also be used in a method for synthesizing hardware that implements the processor described by said model. Said method for synthesizing the hardware comprises the step of deriving from said instruction set graph a netlist containing hardware building blocks and implementing said processor as a hardware device according to said netlist.

According to another aspect of the present invention, a method of generating code for a programmable processor is disclosed. Said method comprising the steps of:

representing said processor as a directed bipartite graph with first and second sets of vertices and with edges, said graph comprising essentially all information about the instruction set and the hardware of the processor, said first set of vertices representing storage elements in said processor, and said second set of vertices representing operations in said processor, linking said graph to tools and libraries required for generating code for said processor, and executing the required code generation phases whereby the required information about said processor is extracted from said graph.

An operation is defined as a primitive processor activity. The operations are annotated with their enabling conditions representing the values of the instruction word that activate them.

In this method, said edges represent valid connections between said operations and said storage elements, said connections modelling the data flow in said processor.

According to one preferred embodiment of the present invention, this method can be adapted for evaluating the optimization phase of generating code for an application algorithm and therefore it further comprises the step of building a decision tree with vertices and branches wherein:

vertices of said decision tree represent primitive operations, whereby said application algorithm contains instances of said primitive operations;

said branches represent possible transformations of said primitive operations according to alternative mapping possibilities in said optimization space, and wherein, the set of vertices of said decision tree comprises vertices representing patterns of other vertices of said set, said patterns being defined during said code generation phases, and said second set of vertices representing operations of said processor.

According to another preferred embodiment, this method can furthermore comprise the steps of:

representing hardware conflicts in said processor as access conflicts on said vertices representing said storage elements; and annotating each vertex of said second set of vertices representing operations with their enabling condition, said enabling condition representing values in the instruction register of said processor that enable the execution of the operation represented by said vertex.

If said method determines valid partial instructions, it further comprises the steps of:

selecting a subset of said second set of vertices representing operations;

verifying that the intersection of the enabling conditions of all operations of said subset is not empty; and verifying that said subset is free of access conflicts on said storage elements.

By checking the enabling conditions and hardware conflicts, the code generator can search for valid operation patterns in the instruction set graph. Valid operation patterns are patterns without conflicts.

Said storage elements can be static and transitory elements. In this case, the method according to the present invention further comprises the steps of representing all hardware conflicts in said processor as access conflicts on said vertices representing said transitory storage elements.

The method can also be adapted to specify data-types supported by a storage element, said method further comprising the steps of:
- specifying different vertices representing one storage element;
- annotating each of said different vertices with a data type supported by said one storage element, and
- specifying an alias relationship between said different vertices representing said one storage element.

The method can also be adapted for representing record storage elements, said method further comprising the steps of:
- specifying a vertex representing the concatenation of several storage elements;
- annotating said vertex with a data type being a record of the data types of said storage elements;
- specifying a structural relationship between said vertex and the vertices representing said storage elements.

The method as defined is adapted for representing operations of which the execution depends on a defined condition, said method further comprising the steps of:
- specifying a subset of said second set of vertices representing operations, characterized in that all vertices in said subset depend on said condition;
- specifying in said subset a vertex;
- specifying an edge of said edges, said edge connecting a vertex of said first set of vertices that represents the storage element where said condition is available with said vertex in said subset, and said edge indicating that said operations represented in said subset can only be enabled when said condition has a specific value.

The execution times of operation are modelled, said method further comprising the steps of:
- annotating an enabling condition of said operation with the relative time step of the corresponding instruction issue with respect to the start of said operation; and
- annotating said operation with the time steps relative to the start of said operation at which said operation accesses the input and output storage elements of said operation.

If the method represents a functional unit in said processor, it further comprises the steps of specifying a subset of said second set of vertices representing operations, all vertices in said subset executing one functional unit.

Said processor includes a controller unit, operations modelling said controller unit are represented as vertices of said second set of vertices representing operations.

The present invention furthermore discloses a retargetable code generator as an executable computer program on a computer for generating code for programmable processors comprising:
- tools to build a directed bipartite graph with vertices and edges which internally represents said programmable processor, said graph comprising essentially all information about the instruction set and the hardware of said processor having first and second sets of vertices, said first set of vertices representing storage elements in said processor, and said second set of vertices representing operations in said processor.
- tools and libraries required to generate code for said processor, and
- means to link said graph to said tools and said libraries, whereby the information about said processor requested during code generation is extracted from said graph.

The present invention furthermore discloses a method of constructing a code generator for a programmable processor comprising the steps of:
- representing said processor as a directed bipartite graph with first and second sets of vertices and with edges, said graph comprising essentially all information about the instruction set and the hardware of the processor, said first set of vertices representing storage elements in said processor, and said second set of vertices representing operations in said processor,
- linking said graph to tools and libraries required for generating code for said processor, and
- executing the required code generation phases whereby the required information about said processor is extracted from said graph.

In another embodiment, this method of constructing a code generator can further comprise the steps of:
- representing hardware conflicts in said processor as access conflicts on said vertices representing said storage elements; and
- annotating each vertex of said second set of vertices representing operations with their enabling condition, said enabling condition representing values of the instruction register of said processor that enable the execution of the operation represented by said vertex.

Said method determines valid partial instructions, and further comprises the steps of:
- selecting a subset of said second set of vertices representing operations;
- verifying that the intersection of the enabling conditions of all operations of said subset is not empty; and
- verifying that said subset is free of access conflicts on said storage elements.

The present invention is also related to a method of simulating the execution of code on a programmable processor which comprises the steps of:
- representing said processor as a directed bipartite graph with first and second sets of vertices and with edges, said graph comprising essentially all information about the instruction set and the hardware of said processor, said first set of vertices representing storage elements in said processor, and said second set of vertices representing micro-operations in said processor, said edges representing valid connections between operations and said storage elements, and said connections modeling the data flow in said processor;
- linking said graph to tools and libraries required for said simulation, and
- executing said simulation whereby the required information about said processor is extracted from said graph.

Furthermore, a retargetable simulator is disclosed as an executable computer program on a computer for simulating the execution of code on a programmable processor comprising:
- a tool to build an internal representation of a directed bipartite graph which represents said programmable processor with first and second sets of vertices and with edges, said graph comprising information about the instruction set and the hardware of said processor, said first set of vertices representing storage elements in said processor, and said second set of vertices representing operations in said processor;

tools and libraries required for simulating said processor, and means to link said group of said tools and libraries whereby the information about said processor requested during simulation is extracted from said graph.

Furthermore, a method of synthesizing a programmable processor is disclosed which comprises the steps of:

representing said processor as a directed bipartite graph with first and second set of vertices and with edges, said graph comprising information about the instruction set and the hardware of said processor;

linking said graph to tools and libraries required for generating a netlist of hardware building blocks;

implementing said processor as a hardware device according to said netlist.

BRIEF DESCRIPTIONS OF THE DRAWINGS

The present invention will be described below in connection with accompanying drawings figures in which:

FIG. 2 represents a schematic overview of the instruction set for the example processor.

Figure 4C:
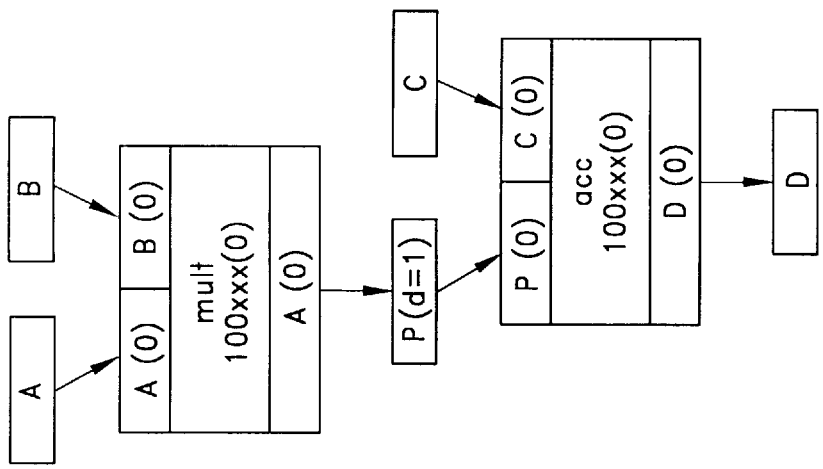
Figure 4B:
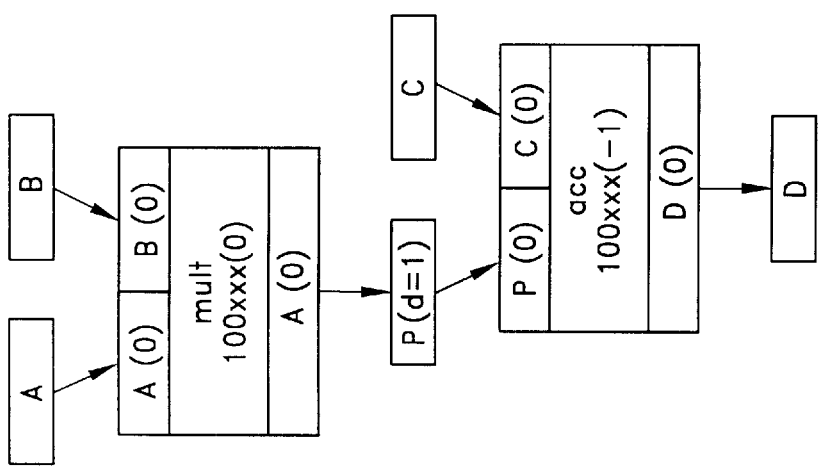
Figure 4A:
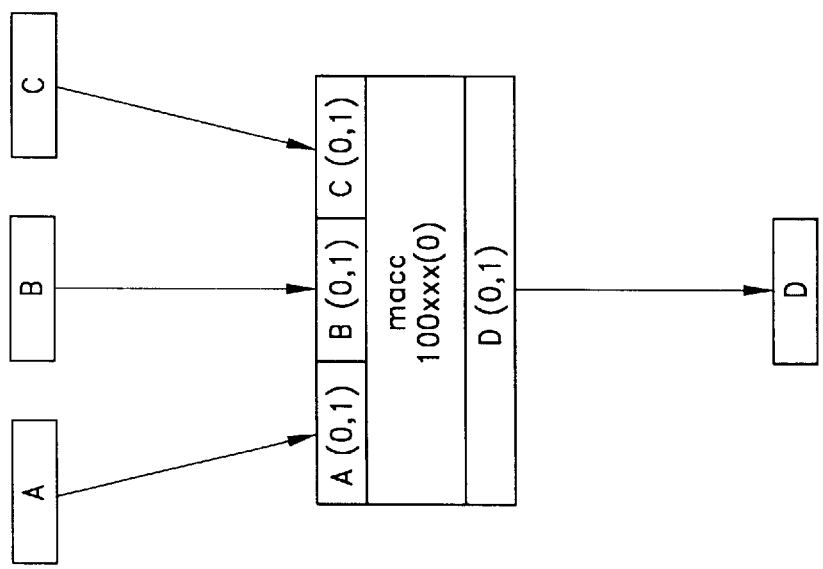

FIGS. 4(a)–4(c) represent different ways of controlling a multicycle multiply-accumulate, modelled in the ISG: (a) non-pipelined; (b) pipelined, data-stationary controlled, and (c) pipelined, time stationary controlled.

Figure 5:
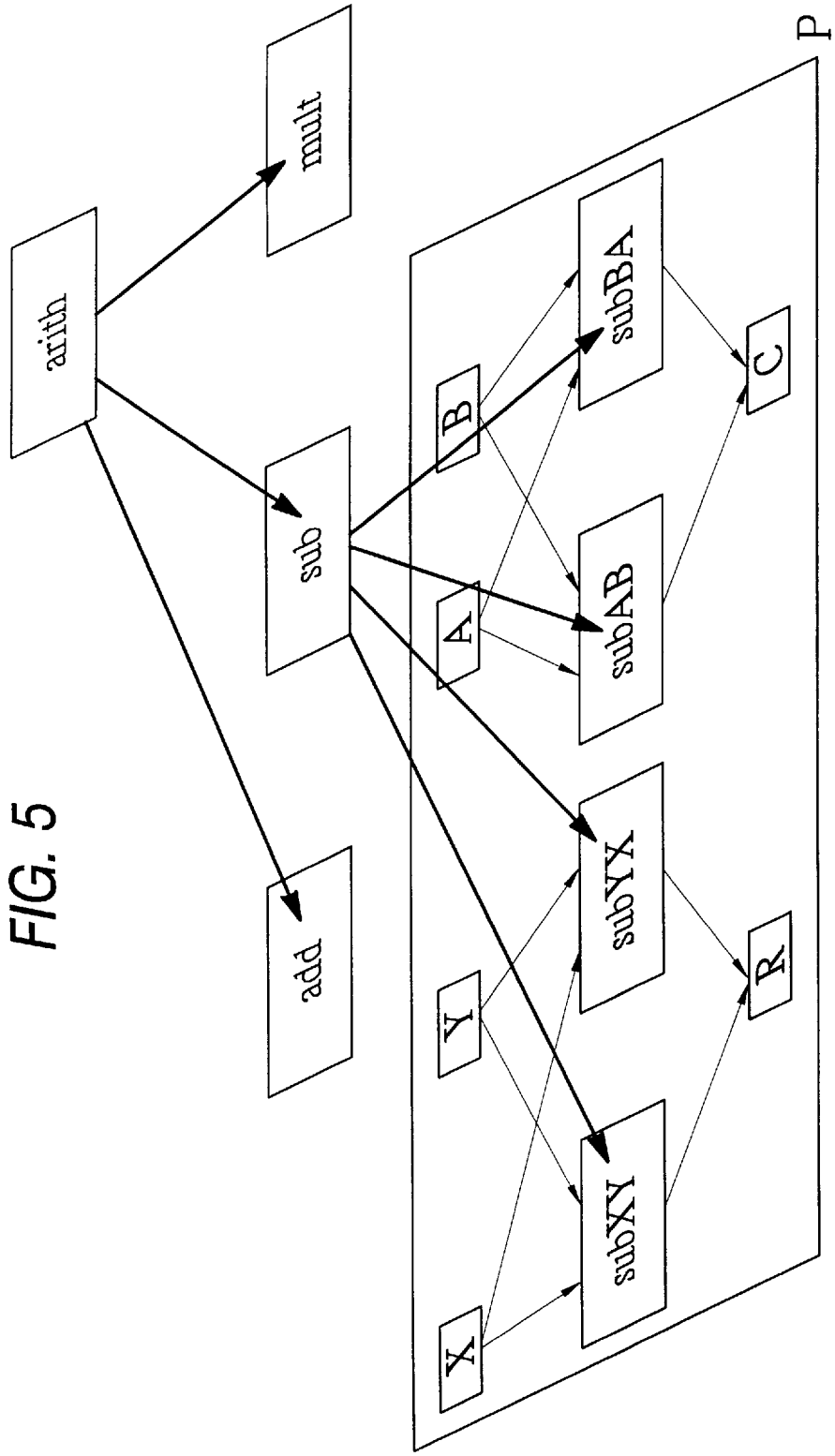

FIG. 5 illustrates the type hierarchy in the operation type library L. The gray plane "P" represents the ISG.

Figure 6C:
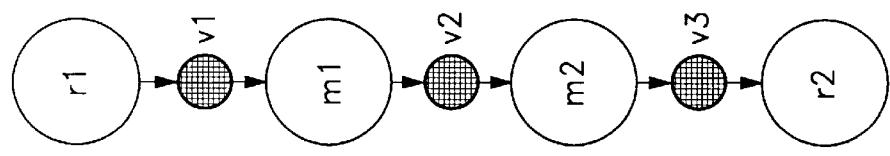
Figure 6B:
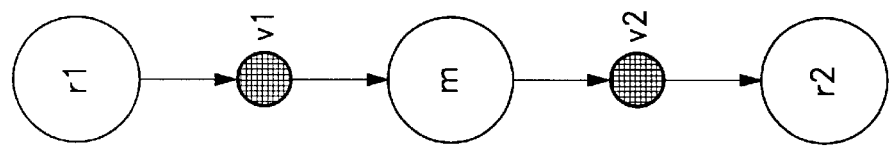
Figure 6A:
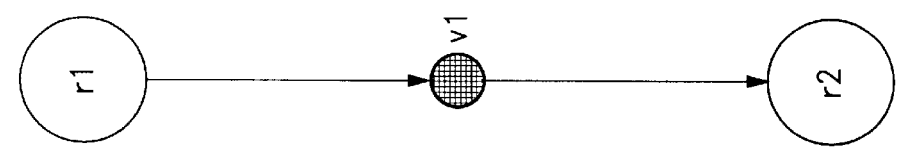

FIGS. 6(a)–6(c) represent different kinds of data dependencies in the DFG: (a) direct data dependency; (b) direct data dependency with move operation; (c) allocated data dependency.

Figure 7A:
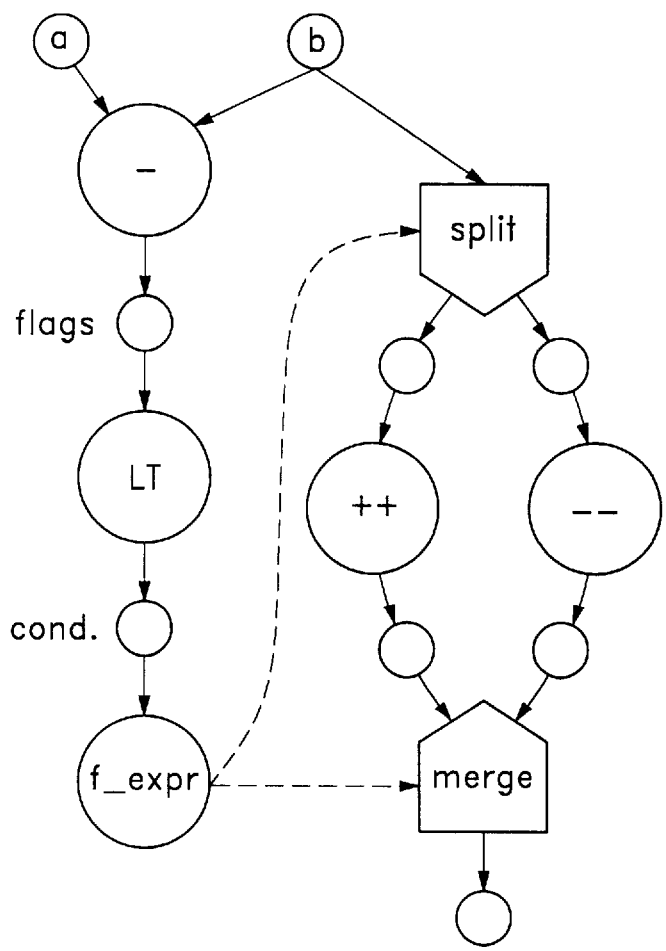
Figure 7B:
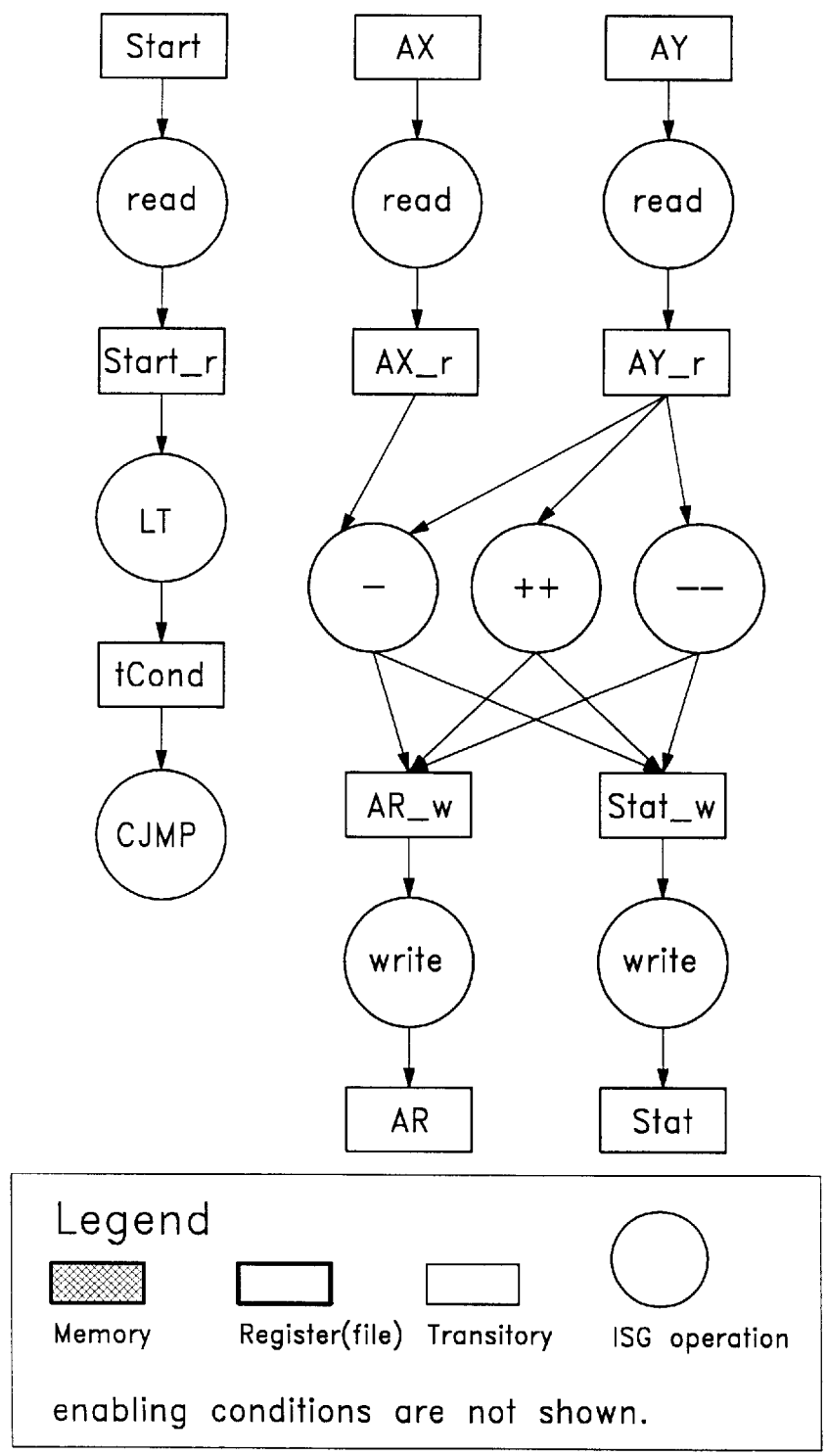

FIGS. 7(a)–(b) show an if-then-else construct in C and the corresponding CDFG in part (a); part (b) shows a small ISG to map the C program of part (a).

Figure 8A:
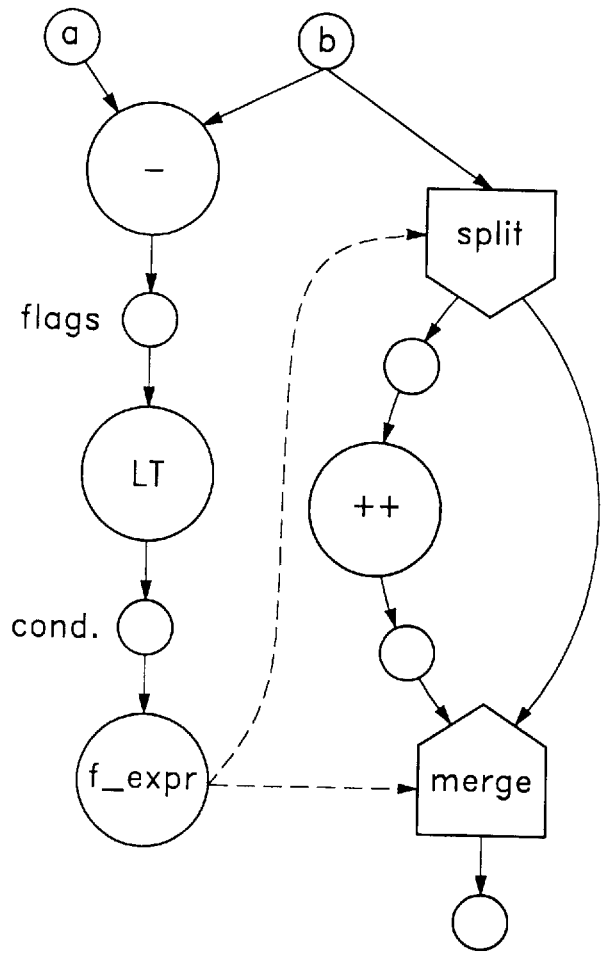
Figure 8B:
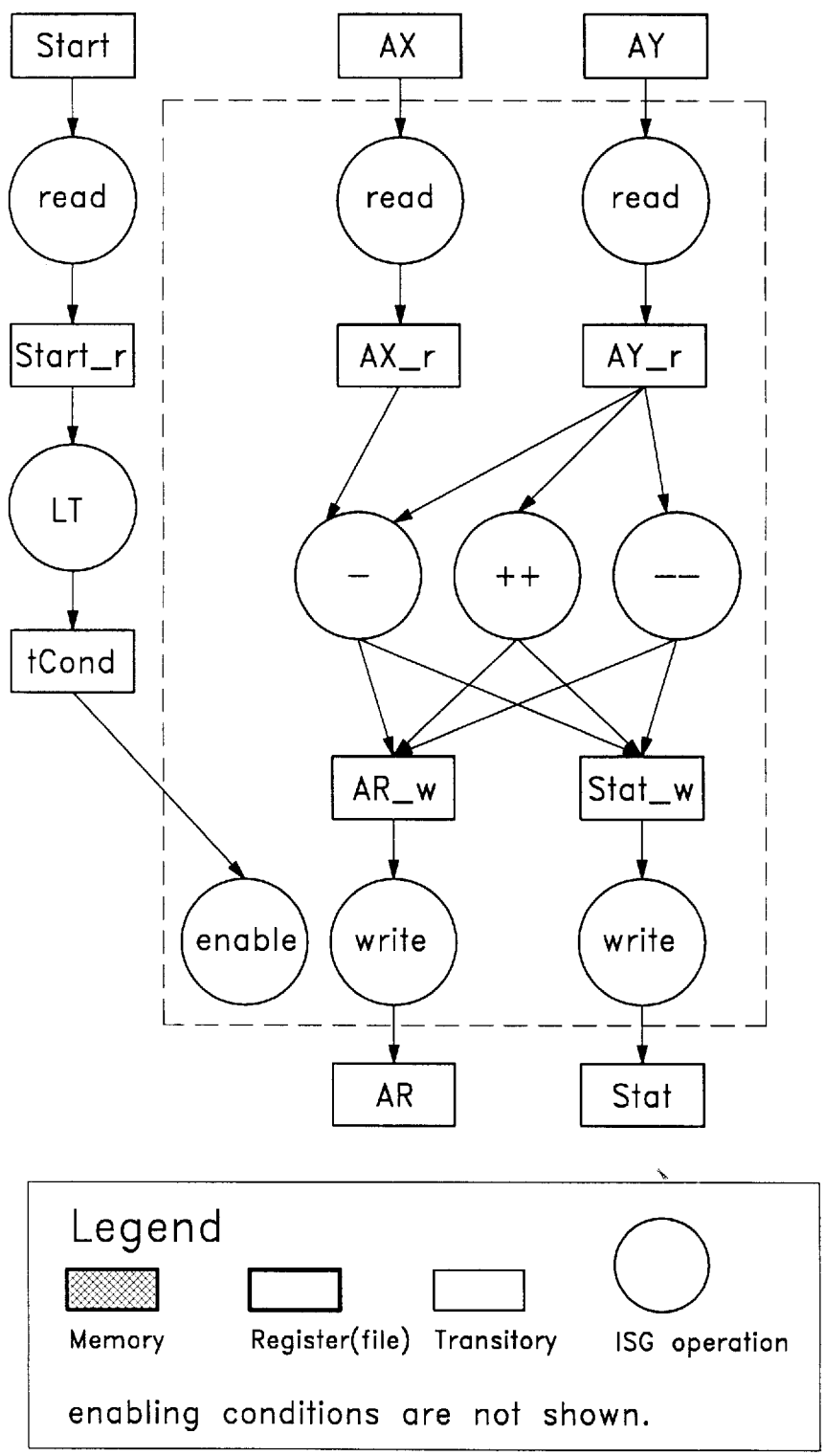

FIGS. 8(a)–8(b) show a conditional operation in C and the corresponding CDFG in part (a); part (b) shows a small ISG to map the C program of (a).

FIGS. 9(a)–9(b) illustrate the modelling of residually controlled operations in the ISG.

Figure 10A:
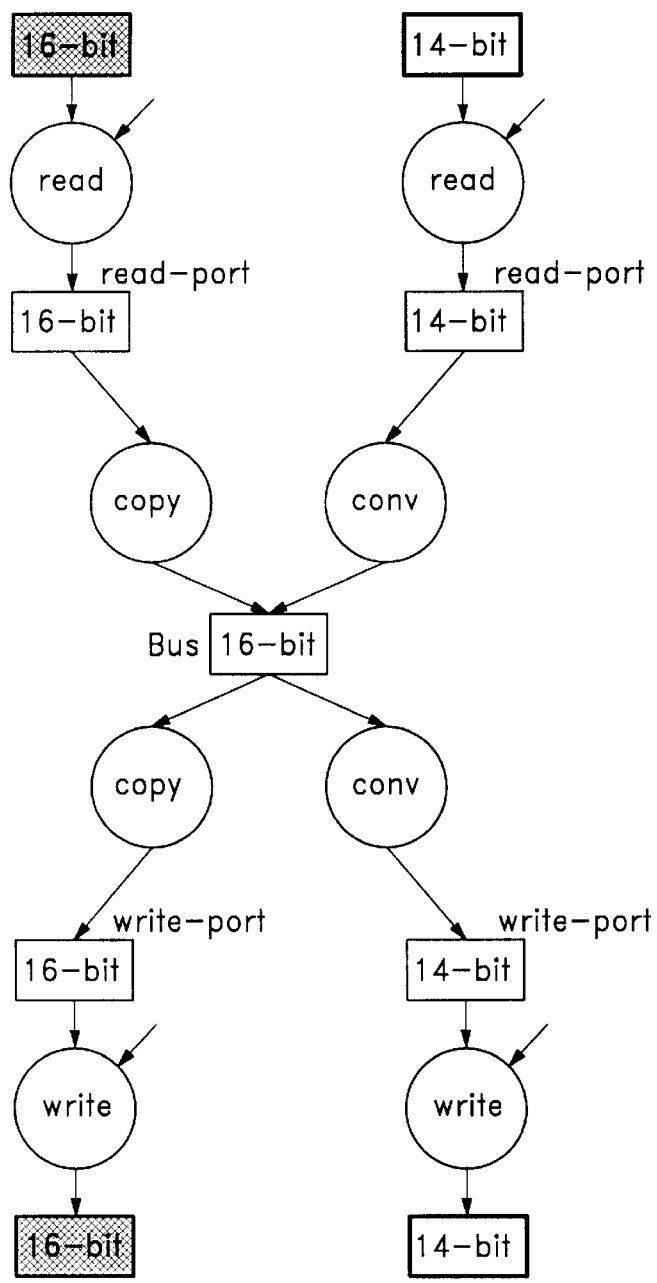
Figure 10B:
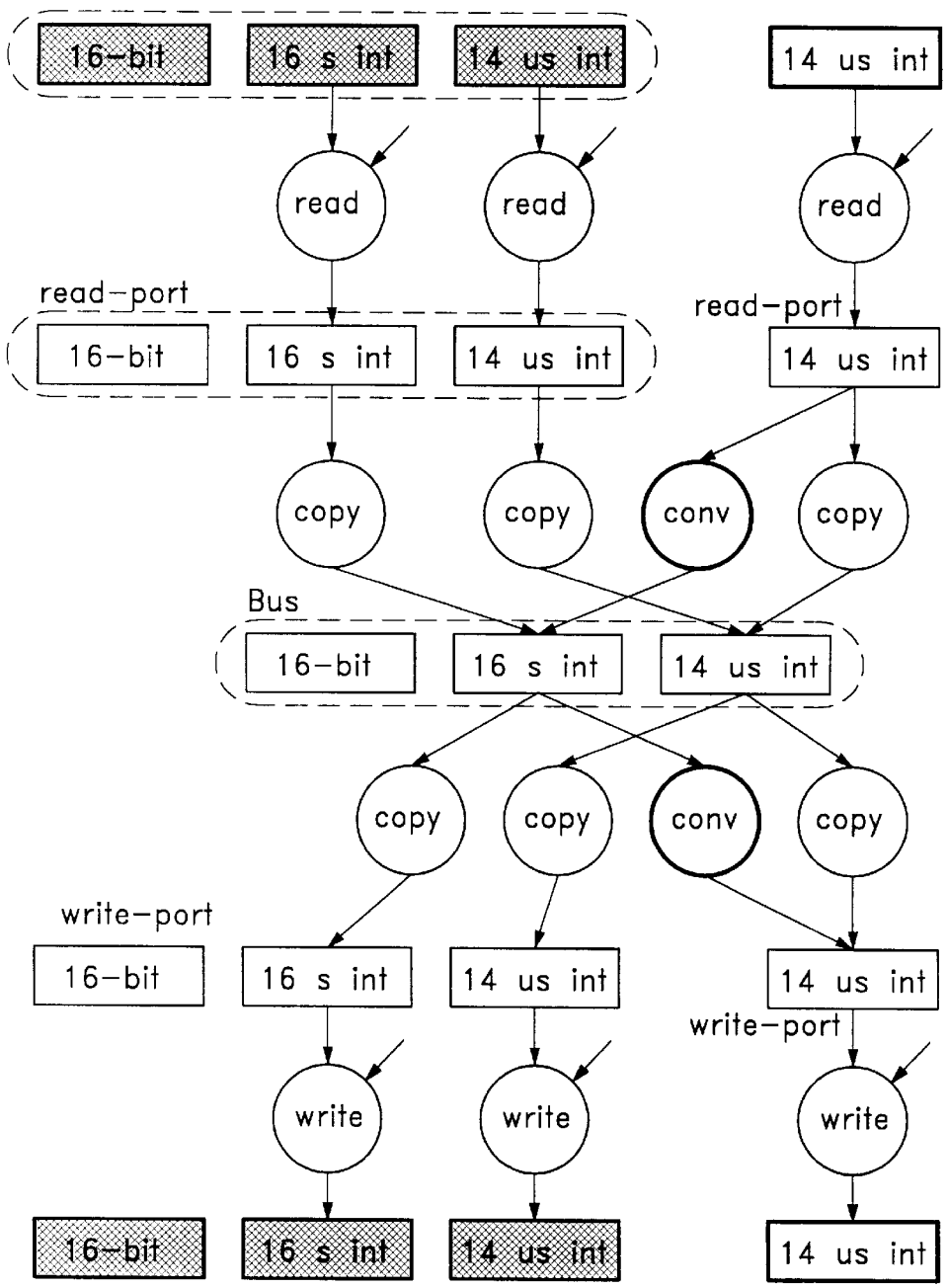

FIGS. 10(a)–10(b) represent two different ways of handling data type information in the ISG.

Figure 11:
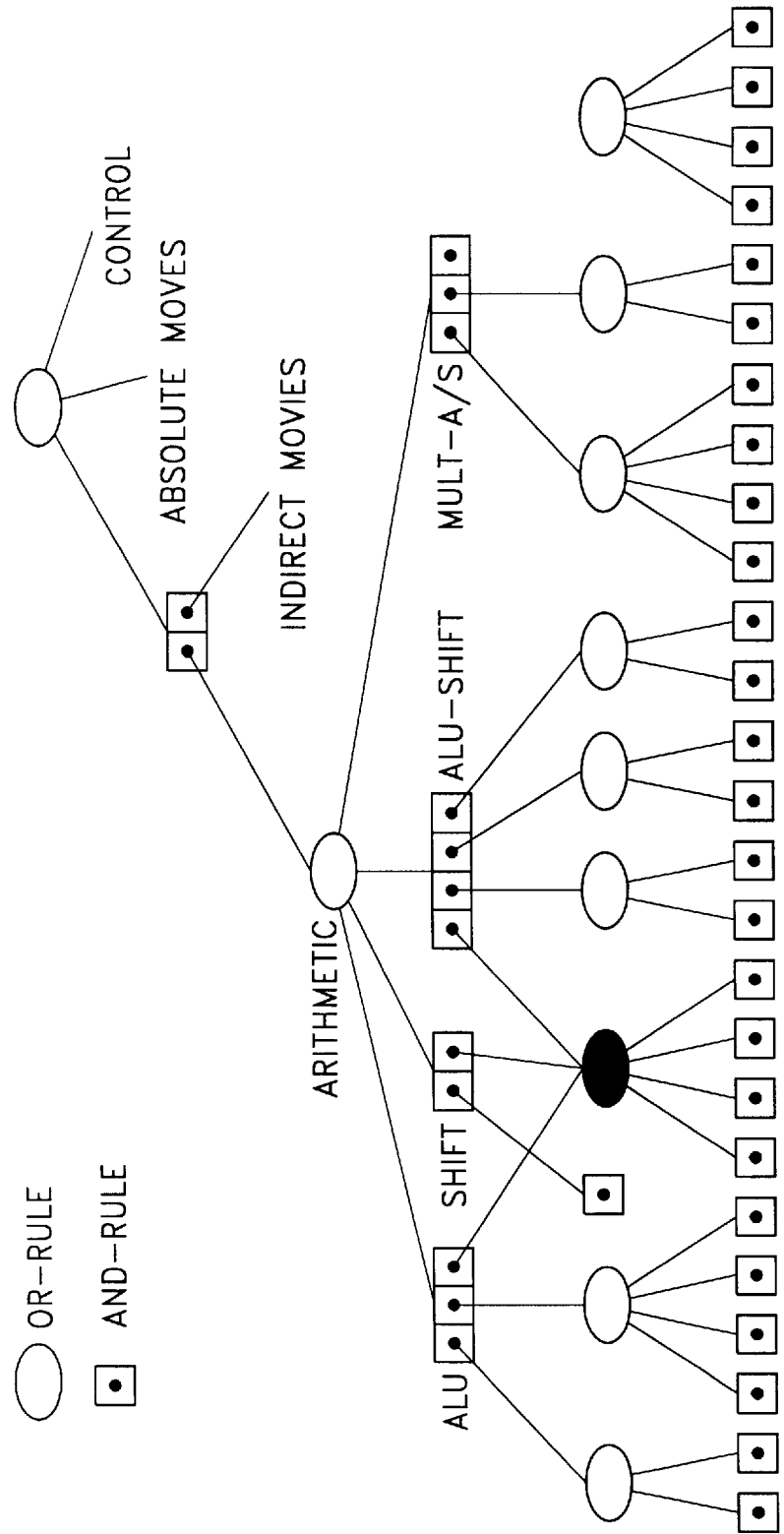

FIG. 11 depicts the hierarchy which is present in the nML description of the example processor.

Figure 12:
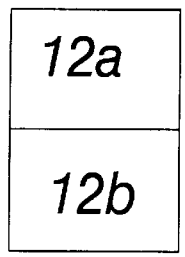
Figure 12A:
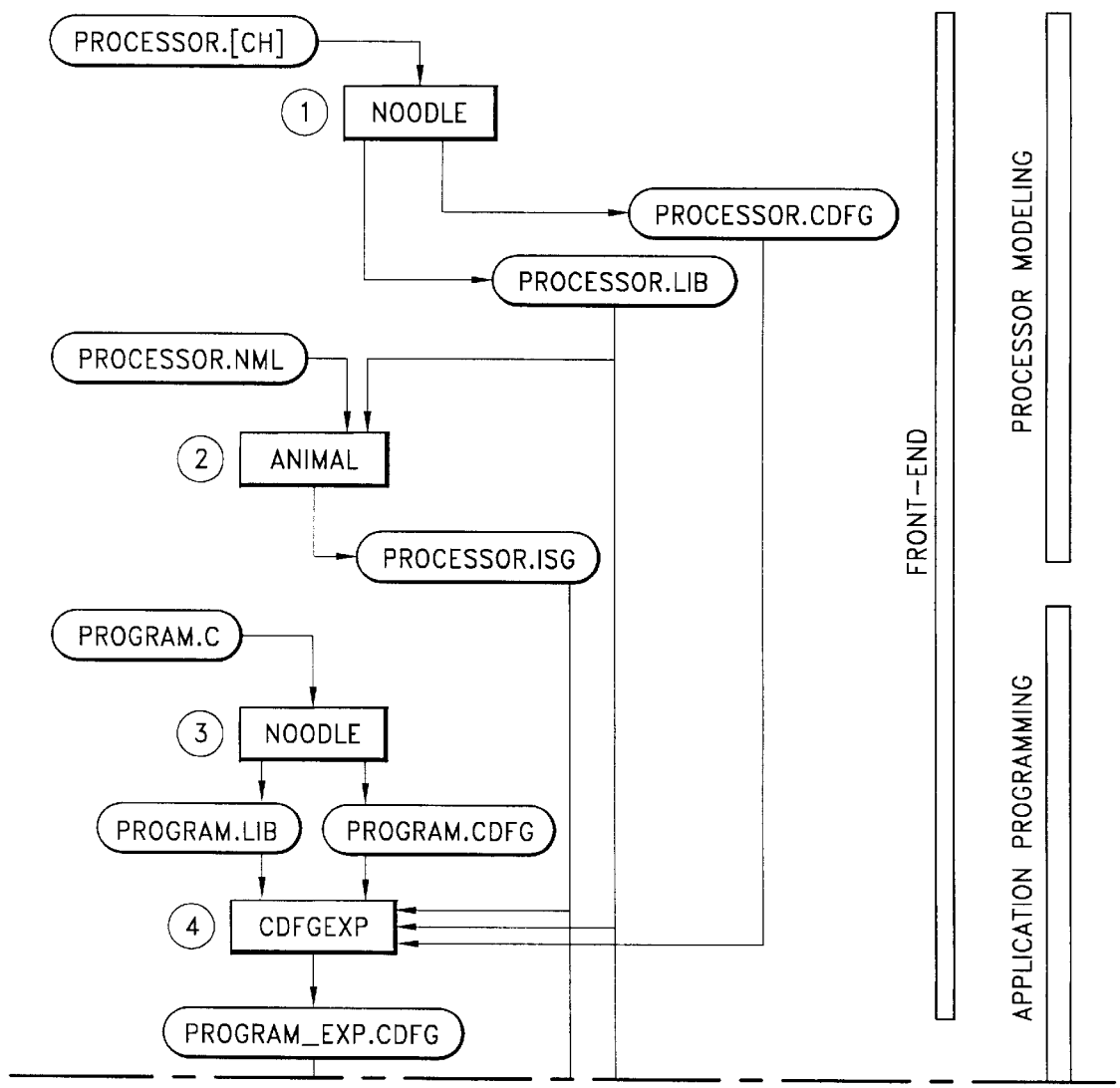
Figure 12B:
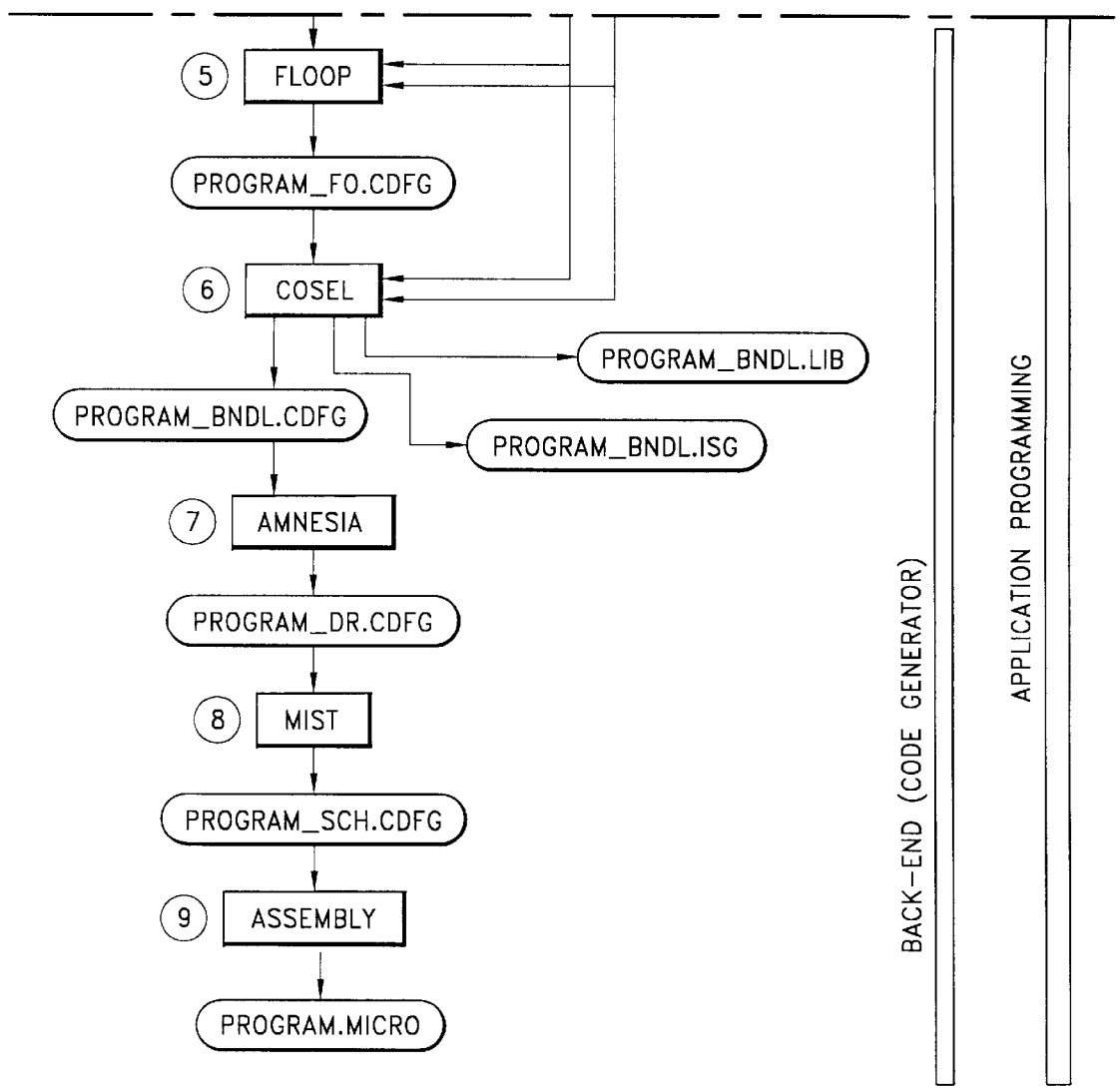

FIG. 12 illustrates the flow diagram of a retargetable compiler.

Figure 13:
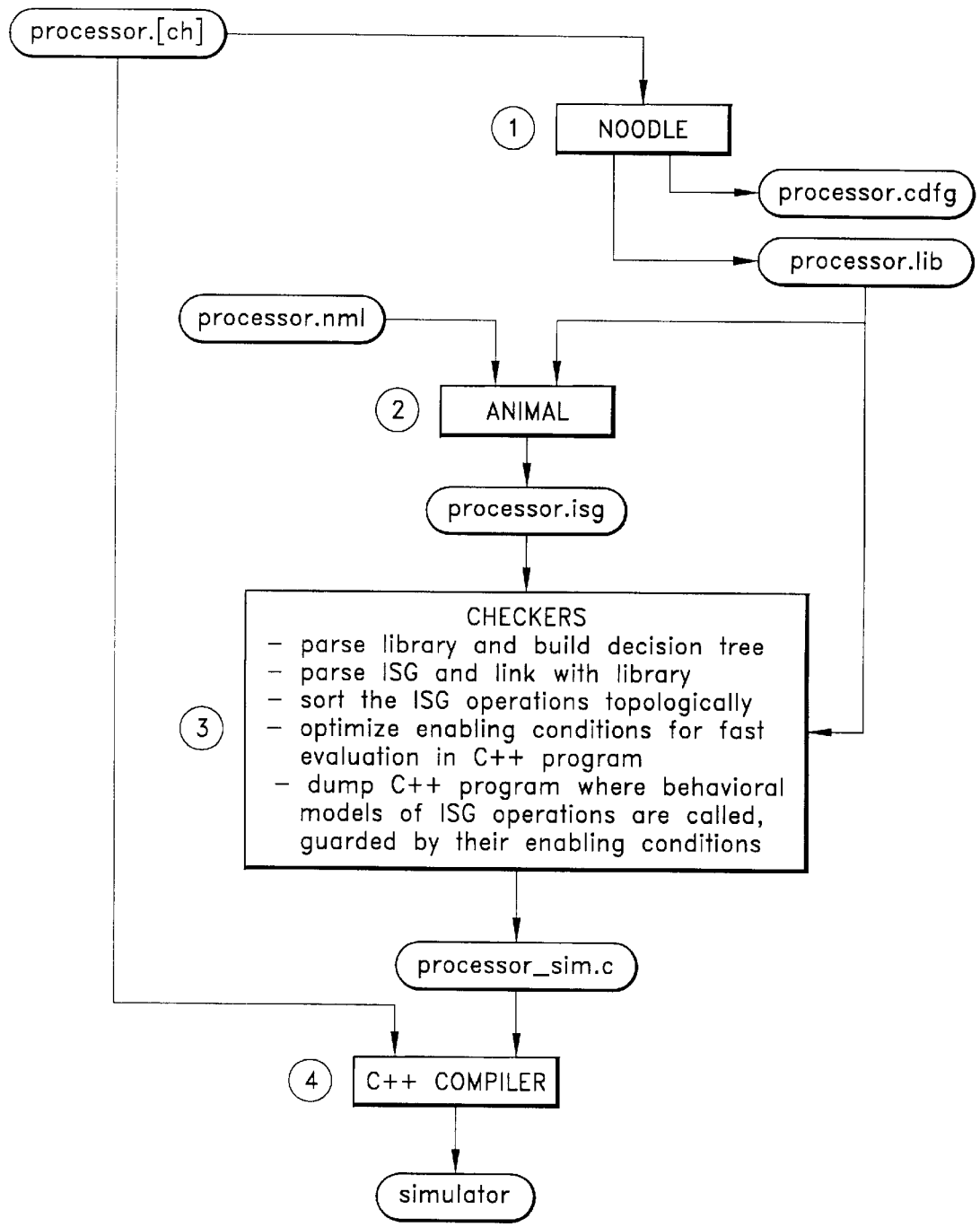

FIG. 13 represents the flow diagram of a retargetable simulator generator.

Figure 14:
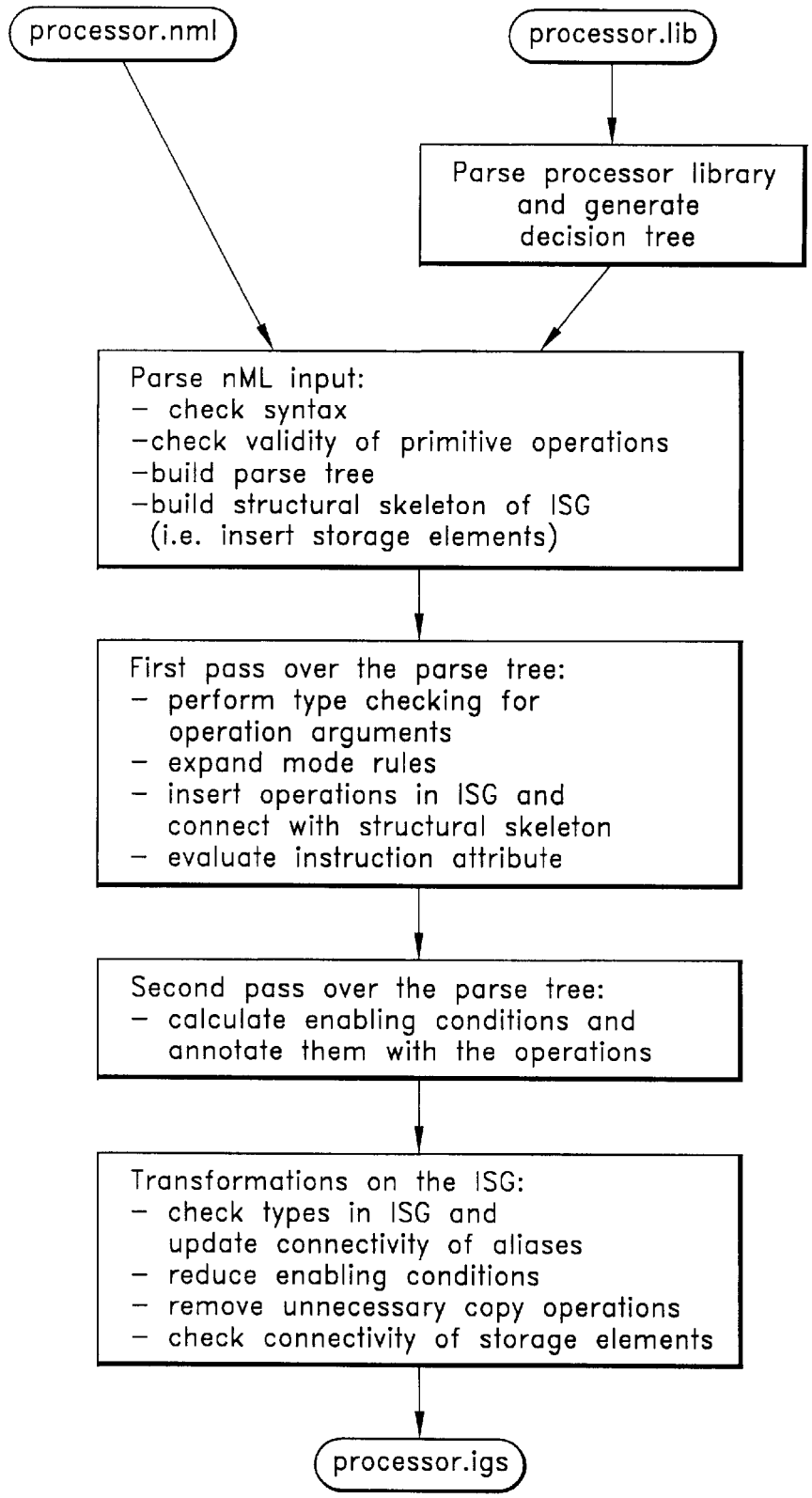

FIG. 14 represents the flow diagram of an nML to ISG translator.

Figure 15:
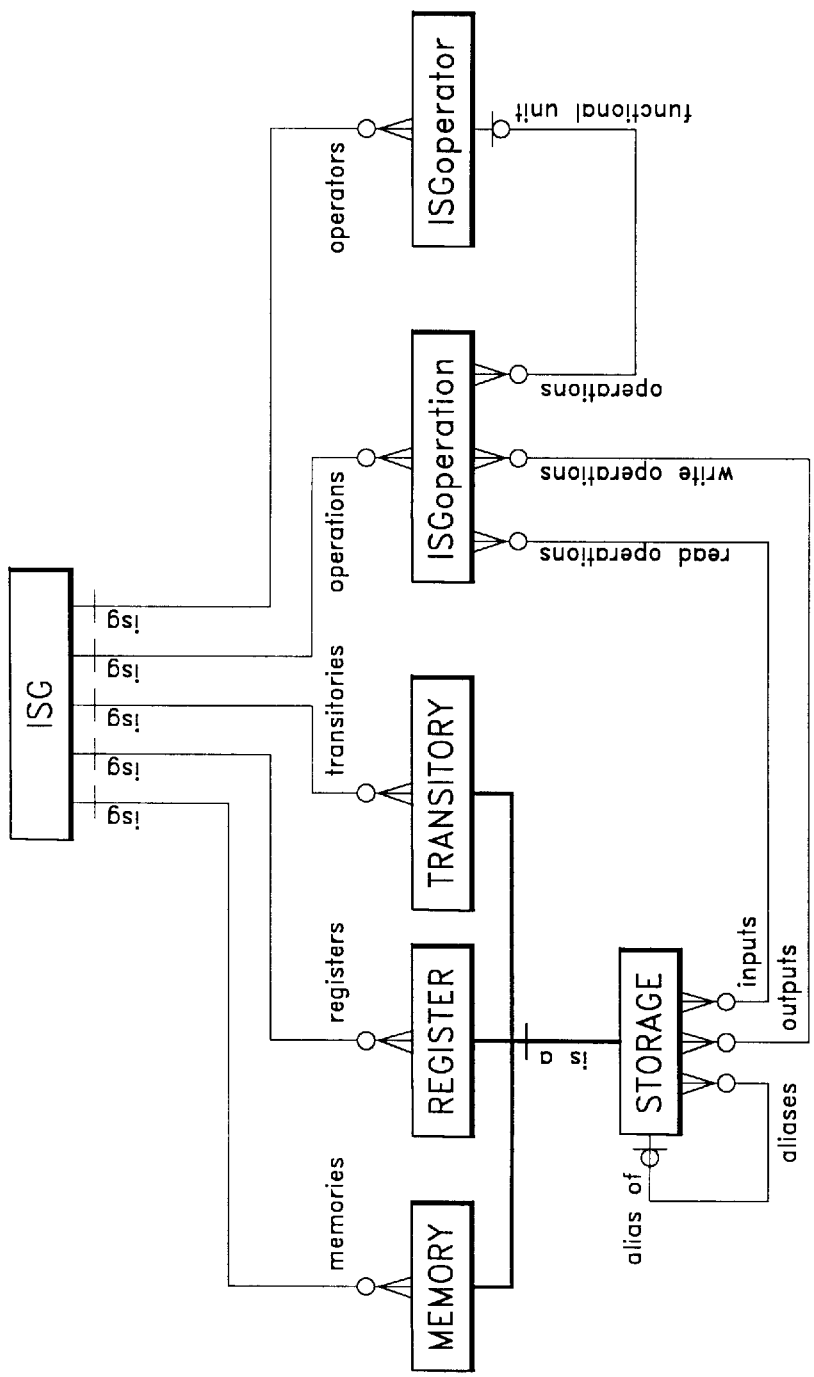

FIG. 15 depicts the information structure diagram of the preferred embodiment of the ISG model.

DETAILED DESCRIPTION OF PREFERRED EMBODIMENTS

A processor model for retargetable code generation and instruction simulation must contain all information about the processor needed to generate correct efficient code and to simulate the content of every storage element during program execution in an instruction cycle accurate way. It must allow code generation phases to find out what operations, or micro-operations, and storage elements are available in the instruction set and how they are interconnected. Code generation and simulation programs must also be able to access information about all possible conflicts in a processor such as encoding restrictions and hardware conflicts. In short, the model must support efficient searches for valid patterns (called bundles) that translate into valid register transfers on the processor (which are enabled by a partial instruction). Also the timing and behavior of operations must be easily accessible.

The processor model should not, however, contain unnecessary details nor predicates to guide the code generator phases or the simulator. Not needed are, for example, the details of the decoding tables, precise timing on the sub-phases of the clock and exact modelling of hardware of which the behavior does not introduce any conflicts.

An example processor

A small example processor will be used to illustrate the concepts of the instruction graph model of the present invention. This processor is derived from a commercial processor for digital signal processing, namely the ADSP-2111 from Analog Devices. It should be understood, however, that the present invention is in no way restricted to this processor. The method is applicable to other commercial processors as well, and the method has already been applied to different ASIPs.

Figure 1:
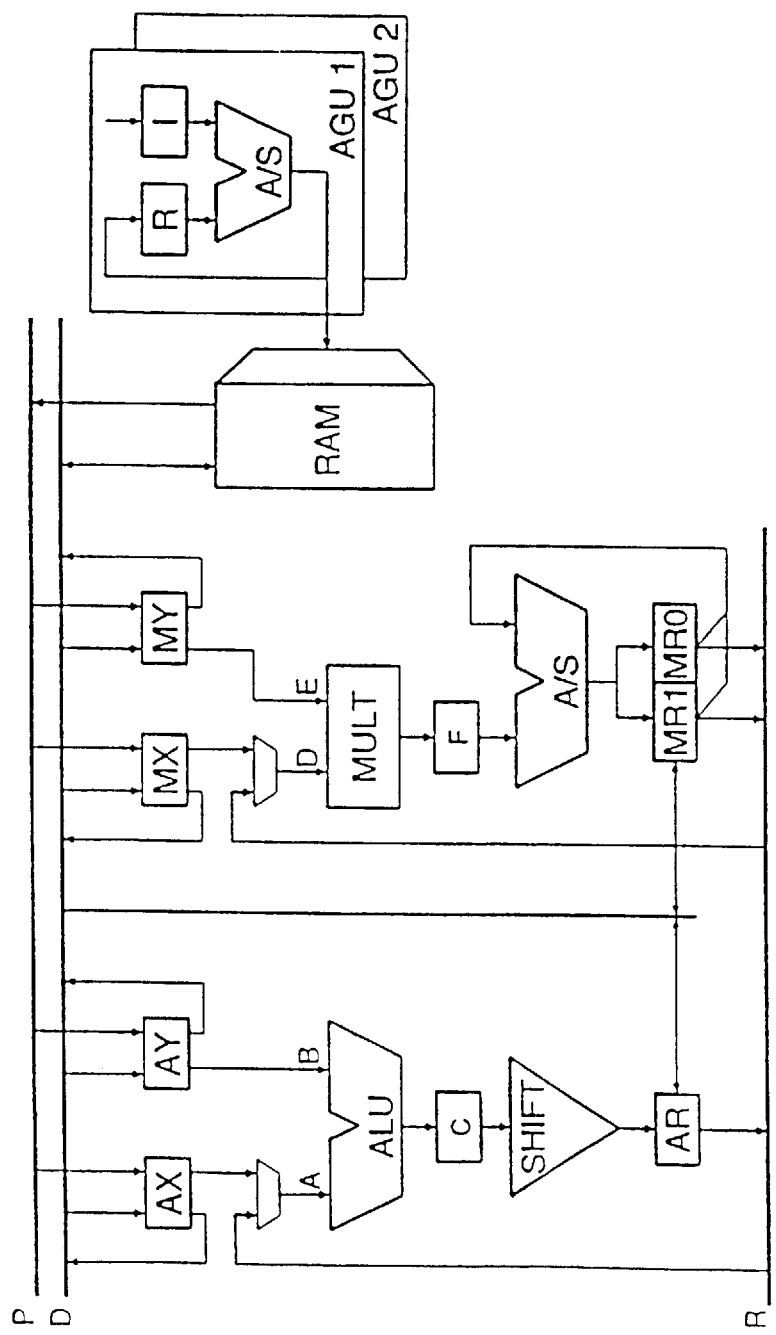
FIG. 1 shows the data path of a small example processor.

The data path (shown in FIG. 1) contains an ALU-SHIFT unit, consisting of an ALU connected through a pipeline register C to a shifter (SHIFT), and a multiply accumulate unit (MULT and A/S, with pipeline register F). Both units have their own input registers (AX,AY;MX,MY, respectively) and result registers (AR;MR1,MR0, respectively), and communicate with each other via the result bus R. The processor has a load/store architecture and can fetch two operands at a time by using both the program bus (P) and the data bus (D).

The instruction set is outlined in FIG. 2 and comprises three formats. The instruction word length is 18 bits (bits are numbered from 0 to 17, with 0 being the most significant bit). In the table, only format bits are shown. The first format, which deals with instructions incorporating an arithmetic operation with one or two indirectly addressed data moves in parallel, is detailed. One can see that the encoding excludes the parallel operation of the two arithmetic parts in the data path. The second format encodes data moves with direct addressing and the third one contains all control flow instructions.

1. A BIPARTITE GRAPH AS A PROCESSOR MODEL

Figure 3B:
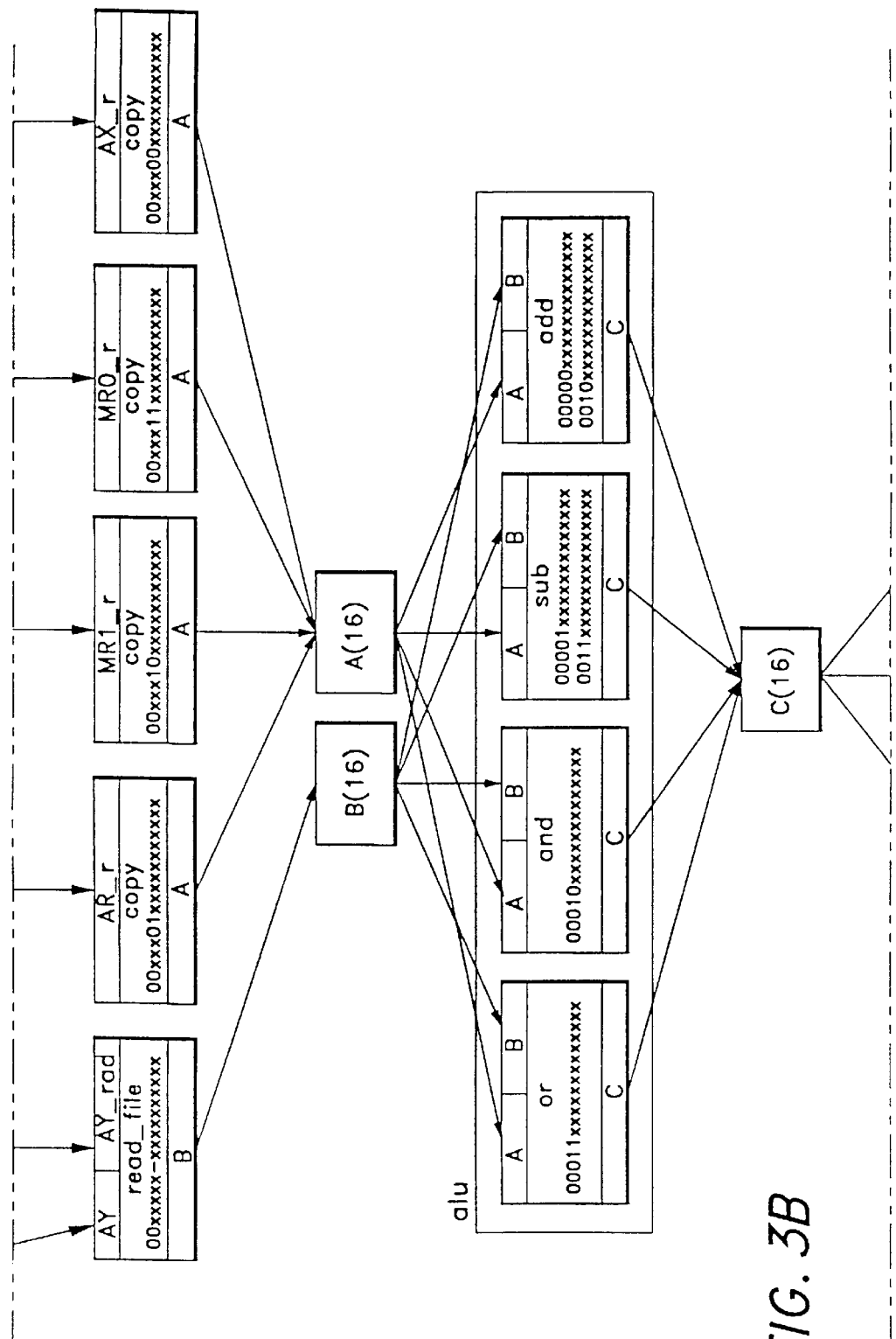
FIG. 3 illustrates the instruction set graph for the (partial) instructions using the ALU in the example processor.
Figure 3C:
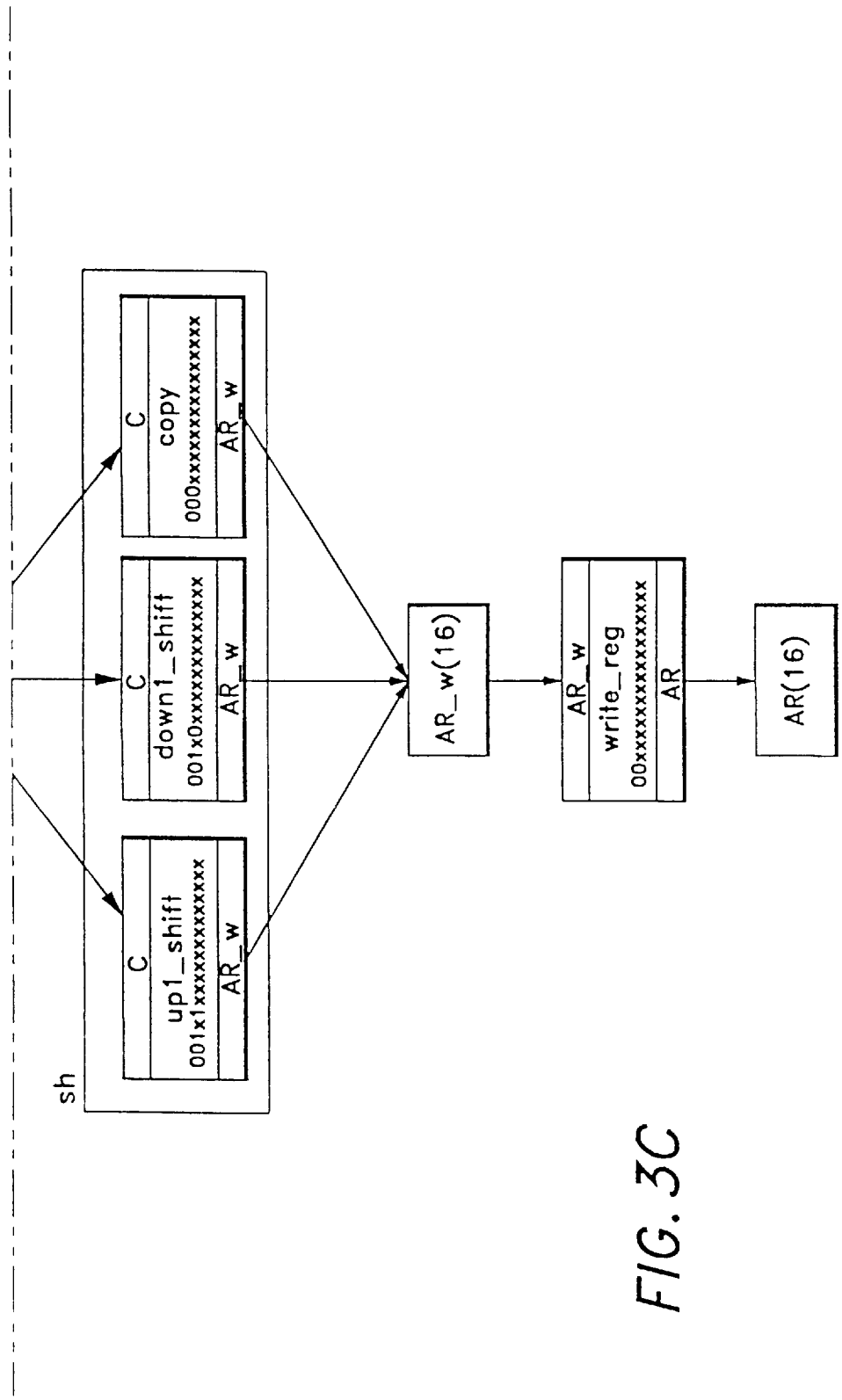

The instruction set graph (ISG) for the present invention is designed in accordance with the above requirements. It is a directed bipartite graph $G_{ISG}$ ($V_{ISG}, E_{ISG}$) with $V_{ISG} = V_S \cup V_I$, where $V_S$ contains vertices representing storage elements in the processor and $V_I$ contains vertices representing its operations. The edges in $V_{ISG} \subset (V_S \times V_I) \cup (V_I \times V_S)$ represent the connectivity of the processor and model data flow from storage, through ISG operations, to storage. FIG. 3 contains a part of the ISG for the example processor; the details of this figure will be explained below.

ISG operations

ISG operations are primitive processor activities transforming values in storage elements into other values in other storage elements.

In each instruction, the processor executes a number of operations. Conversely, a certain operation can be enabled by several instructions. The set of instructions that enables an operation i in the ISG is called its enabling condition and denoted by enabling(i). It is currently assumed that the binary encoding of instructions is available to be used in the enabling conditions. However, the enabling conditions could also be defined in a more abstract way, using assembler-like symbols (mnemonics) for instruction parts. In FIG. 3, the enabling conditions are shown in a binary cubic representation, with "x" meaning "don't care". A subset of ISG operations $V_{I_o} \subset V_I$ is said to have an encoding conflict when $\cap_{i \in V_{I_o}}$ enabling(i)=$\Phi$. The intersection of enabling conditions $\cap_{i \in V_{I_o}}$ enabling(i) is the enabling condition for the set $V_{I_o}$, which is empty in the case of an encoding conflict. A multiplexer is for example modelled as a set of copy operations having a common output storage element such that all pairs of copy operations have encoding conflicts.

Storage

In the ISG, a distinction is made between two kinds of storage elements. See, for example Landskov, Davidson et al., "Local microcompaction techniques", *ACM computing surveys*, 12(3)261–294, 1980. In particular, the two kinds of storage elements are defined as follows:

1. Static storage holds its value until explicitly overwritten. The same value can be read several times. A static storage element has a certain capacity of values it can contain at the same time (e.g. the number of fields in a register file). Static storage consists of memory and controllable registers, respectively denoted by the sets $V_M$ and $V_R$.

2. Transitory storage passes a value from input to output with a certain delay. A transitory storage element will simply be called a transitory. A transitory can only contain one value at a time. Examples are buses and wires, which have zero delay, and pipeline registers which have a non-zero delay. Transitories form the set $V_T$.

Together, the storage elements define a structural skeleton of the target machine ($V_S = V_{M \cup V_R \cup V_T}$). In FIG. 3, storage elements are depicted as small rectangular boxes, each having a label denoting their data type between parentheses. In the example the data type is named num and is an additional interpretation of a bit string of length 16. The storage elements at the top and bottom are registers, all others are transitories.

A code generator must not only check for encoding restrictions between operations, but also for hardware conflicts (or structural hazards), which are not always prevented by the encoding conflicts. For example, hardware conflicts can occur between operations of orthogonal instruction fields. Such instructions are called "illegal" instructions. In the case of pipelined processors, hardware conflicts can even occur between operations of different instructions and timing profiles must be taken into account. An interesting feature of transitories is that they are used to model hardware conflicts in code generation.

A hardware conflict is represented as an access conflict on a transitory. The code generator will avoid access conflicts on transitories, by allowing at most one operation to write to each transitory in each machine cycle. To illustrate the modelling of hardware conflicts, two examples will be considered Different tristate drivers can be connected to the same bus and are not allowed to write to it during the same cycle, even not when an instruction encoding allows it. To prevent the code generator from generating such an instruction, the bus is modelled as a transitory and the tristate drivers as copy operations. The conflict then turns into an access conflict on the transitory (i.e. a bus conflict) which can be checked and avoided by the code generator. This resembles the way a multiplexer is modelled in the ISG, but in the case of a bus conflict the enabling conditions of the copy operations are not exclusive. Remark that in the ISG of FIG. 3 the result bus has not been modelled explicitly (it is merged with the multiplexer) because no result bus conflicts occur with the example instruction set.

Read/write ports of static storage are also modelled as transitories in order to make the code generator check for port conflicts. Port conflicts occur when two operations try to access a storage element via the same port in the same cycle.

In summary, memory and register nodes are included in the ISG as they are present in the architecture. Transitories on the other hand, are not necessarily uniquely related to physical interconnect resources in the architecture. An operation may for example encapsulate a physical interconnection, or a transitory may be needed to connect the parts of an operation that is artificially split. It is however crucial that the correct processor behavior is represented, including the hardware conflicts.

Timing

A multi-cycle instruction may activate operations some cycles after the instruction issue. Therefore an enabling condition is annotated with the relative time step of the instruction issue with respect to the start of the operation. The term operation stage will be used to denote a time step relative to the (execution) start of an operation. For example, operation stage 0 and 1 are respectively the first and second step in which the corresponding operation is active, and stage −1 is the last time step before the operation becomes active. Each operation is also annotated with the operation stage at which it accesses its input and output storage elements.

The operations and instructions in the previously discussed example processor are all single-cycle, so the operation timing is omitted in FIG. 3, but it is annotated in FIG. 4 for some fictitious examples. Operation stages are shown between parenthesis, as annotations of enabling conditions and of input and output arguments of ISG operations. FIG. 4(*a*) shows how a two-cycle, non-pipelined multiply-accumulate operation would look like in the ISG, assuming that it needs its input and output storage elements during both cycles.

In data-stationary code, one instruction controls all operations that are executed on a data item as it is traversing the pipeline (P. M. Kogge, "The Architecture of Pipelined Computers", *Advanced Computer Science Series*, McGraw-Hill Book Company, 198 1).

A data-stationary instruction that controls a two-cycle multiply-accumulate pipeline, is modelled by two ISG operations, as shown in FIG. 4(*b*). The operations are connected by a transitory with a delay of one cycle and each of them is annotated with operation stages. The code generator can then easily derive the timing of the complete pattern and replace the pattern by a more abstract operation, as will be explained in the sequel.

If the same multiply-accumulate pipeline is time-stationary controlled, it is modelled as in FIG. 4(*c*). In time-stationary code, one instruction controls all operations that are executed during one cycle, possibly on several sets of data (P. M. Kogge, "The Architecture of Pipelined Computers", *Advanced Computer Science Series*, McGraw-Hill Book Company, 1981).

To allow the code generator to also replace this operation pattern by an abstract operation, multi-cycle operations are allowed to have multiple enabling conditions, for example one for each cycle.

2. CODE GENERATION USING THE ISG MODEL

In this section it will be explained how the ISG processor model is used to generate code for the execution of a given algorithm on a given processor. In the sequel an overview of a retargetable compiler, using the preferred embodiment of the present invention, is given by means of a flow diagram. The implementation of the ISG is also discussed in the sequel.

The algorithm to be mapped on the processor is given as a data flow graph (DFG) which also takes the form of a bipartite graph $G_{DFG}$ ($V_{DFG}, E_{DFG}$), where $V_{DFG} = V_O \cup V_V$ with $V_O$ representing the operations and Vv representing the values they produce and consume. The edges in $E_{DFG} \subset (V_O \times V_V) \cup (V_V \times V_O)$ represent the data flow. Code generation then consists in finding a mapping of $G_{DFG}$ ($V_{DFG}, E_{DFG}$) onto $G_{ISG}$ ($V_{ISG}, E_{ISG}$) with values in $V_V$ mapped on storage elements in $V_S$ and the DFG operations of $V_O$ on corresponding ISG operations of $V_I$.

The code generation task is split in subsequent phases. First, during the code selection phase, it is decided on which values will be bound to transitories. A data dependency of which the corresponding value is bound to a transitory, results in a fixed timing constraint because of the delay of the transitory. This timing constraint may not produce a conflict between the involved DFG operations, otherwise it can not be satisfied and the value must be bound to a static storage element. Conflict free DFG operations with fixed timing constraints are grouped, and each implementation of such a group is called a bundle (or a valid pattern). After this, during the register allocation phase, the remaining values are bound to static storage elements and the DFG is completed with the necessary data transfers. Finally, during the scheduling phase, the bundles are bound to time. Below, more details are given on how the DFG is bound to the ISG.

Refinement

To represent the different ways in which a DFG operation can be mapped on the ISG, an operation type hierarchy is used. FIG. 5 shows an example of this hierarchy for a subtraction, where four implementations exist for the abstract sub operation type. Each implementation is a subtype of an abstract operation type, for example, subXY is a subtype of sub. The abstract operations and the operations in the ISG form a library L of primitive operations of which DFG operations are instances. Each DFG operation is an instance of an operation type in L:

$$\forall o \in V_O, \exists l \in L : type(o) = l.$$

In fact, the library L is a decision tree with vertices and branches which is used in the mapping of a DFG to the ISG. Vertices correspond to primitive operations, and branches represent possible refinements of primitive operations according to alternative mapping possibilities in the optimization space. As shown by the example in FIG. 5, where the ISG is the gray plane labelled "P", the ISG is thus completely integrated with the library.

During code generation, DFG operations are refined until they are instances of ISG operations, so they can be executed by the processor. Each operation $$o \in V_O : type(o) \in L$$

is replaced by a refined operation r such that:

$$type(r) = i \land i \in V_I \land i \text{ is a subtype of } type(o) \quad (1)$$

Binding data dependencies

Consider a data dependency between two refined DFG operations $r_1$ and $r_2$, with corresponding value $v_j \in V_V$. Assume that the DFG operations are bound by the code generator to the ISG operations:

$$i_1 = type(r_1) \text{ and } i_2 = type(r_2).$$

The function output(i, n, s) returns the storage element on which i writes its n-th output during operation stage s and the function input(i, n, s) returns the storage element from which i reads its n-th input during operation stage s.

To simplify the notation, it is assumed in the following that the respective integers n and s are chosen according to the data dependency under consideration.

The code generator has different alternatives to bind a data dependency to the ISG. If a data dependency is bound to a path in the ISG that does not include a static storage element, it will result in a fixed time constraint between the involved DFG operations. It is therefore called a direct data dependency. FIG. 6(a) shows the binding of a data dependency where:

$$output(i_1, n, s) = input(i_2, n', s') = t; \ t \in V_T.$$

Value $v_1$ is then bound to the transitory t, denoted carrier $(v_1) = t$. However, in the more general case with output($i_1$, n, s)≠input($i_2$, n', s'), the code generator has to add a move operation m to the DFG, as shown in FIG. 6(b).

Operation m moves its input value v, along a path in the ISG, from carrier($v_1$) to carrier($v_2$), with $v_2$ being its output value. Generally, a move operation is implemented by ISG operations in the set $V_I^{move} \subset V_I$ that contains copy operations to copy values between transitories, read and write operations to access register(file)s, and load and store operations to access memories.

The set of ISG operations that are selected by the code generator to implement a particular move operation m, is returned by the function delivery(m). For the data dependency of FIG. 6(b), the move operation will be implemented by a series of copy operations, according to following equations (for operations that have one input and one output, input() and output() need only two arguments):

$$delivery(m) = \{c_1, c_2, \ldots, c_p\} \subset V_I^{move} \quad (2)$$

$$carrier(v_1) = output(i_1, n, s) = input(c_1, s'_{k+1}) = t_0 \quad (3)$$

$$\forall k: 1 \leq k < p: output(c_k, s_k) = input(c_{k+1}, s'_{k+1}) = t_k \quad (4)$$

$$carrier(v_2) = input(i_2, n', s') = output(c_p, s_p) = t_p \quad (5)$$

$$\{t_0, t_1, t_2, \ldots t_p\} \subset V_T \quad (6)$$

In FIG. 6(c), an allocated data dependency is shown. Such a data dependency is bound to a path in the ISG that includes a static storage element. It also holds for an allocated data dependency that output($i_1$, n, s)≠input($i_2$, n', s'), but now two move operations $m_1$ and $m_2$ are added to the DFG by the code generator. Operation $m_1$ moves $v_1$ from carrier($v_1$)∈$V_T$ to carrier($v_2$)∈$V_{R \cup VM}$ and $m_2$ moves $v_2$ to carrier($v_3$)∈$V_T$.

Because $v_2$ is bound to a static storage element, delivery (m,) will now contain a write or a store operation and analogously delivery($m_2$) will contain a read or a load operation. Equations similar to equations (2) to (6) can be written down for each of these delivery() functions.

Correctness constraints of bundles

A bundle (valid pattern) is defined as a set of DFG operations that are bound to the ISG and for which following properties hold. Two operations that have a direct data dependency will belong to the same bundle and two operations having an allocated data dependency must be in different bundles. Because of the direct data dependencies, the timing relations between operations in a bundle are fixed and will be the same in the final schedule. Consequently, operations in a bundle may not have encoding conflicts nor hardware conflicts with each other, for any of their operation stages. The code generator can prevent conflicts by changing a direct data dependency into an allocated data dependency, thereby removing the corresponding time constraint and splitting the bundle.

In the remainder of this paragraph, some definitions are introduced to eventually define formal correctness constraints for bundles.

Let the resources that an operation $r \in V_O$ uses during operation stage s be given by resources$(r, s) = \{t \in V_T | \exists n : t = $output(type $(r)$, n, s)$\}$. The enabling condition needed in operation stage s for operation r is given by enabling$(r, s)$. The functions resources$(m, s)$ and enabling$(m, s)$ for a move operation m are also defined and respectively yield the appropriate outputs and enabling conditions of ISG operations $c \in$ delivery$(m)$. Below, the symbol o will be used, meaning either a refined operation r or a move operation m.

The function resources$(o, s)$ can be seen as an access function to a reservation table for operation o (P. M. Kogge, "The Architecture of Pipelined Computers", *Advanced Computer Science Series*, McGraw-Hill Book Company, 1981). It returns the resources that must be reserved by the code generator for operation o at operation stage s. Similarly, the code generator must reserve the instruction register for operation o, so that at operation stage s it contains one of the instructions returned by enabling$(o, s)$.

Further, the functions time$(o, s)$ and time$(B, s)$ are defined to give the absolute time on which stage s of respectively operation o or bundle B is executed. In analogy to an operation stage, a bundle stage is defined as the time step relative to the execution start of the corresponding bundle. The function stages$(o)$ returns the operation stages where operation o claims either a resource or an enabling condition and the function stages$(B) = \{s | \exists o \in B, \exists s_o \in $stages$(o):$time$(B, s) = $time$(o, s_o)\}$ returns the stages where the bundle B claims either a resource or an enabling condition.

Finally, the predicate direct$(o_p, o_j)$ is defined to indicate whether $o_p, o_j \in V_O$ have a direct data dependency and allocated$(o_p, o_j)$ to indicate an allocated data dependency.

At this point, the correctness constraints for bundles can be formalized: constraint (7):

$$\forall o_i, o_j \in V_O, o_i \in B_j : \text{direct}(o_i, o_j) \Rightarrow B_i = B_j$$

Constraint (7) expresses that two operations having a direct data dependency must belong to the same bundle. Two operations having an allocated data dependency must be in different bundles:
constraint (8):

$$\forall o_i, o_j \in V_O, o_i \in B_j : \text{allocated}(o_i, o_j) \Rightarrow B_i \neq B_j$$

Because the timing relations between operations in a bundle are fixed and will be the same in the final schedule, operations in a bundle may not have hardware conflicts nor encoding conflicts with each other, for any of their operation stages. This is formalized by the following two constraints constraint (9):

$$\forall o_i, o_j \in B, \forall s \in \text{stages}(o_i), \forall s' \in \text{stages}(o_j):$$

time$(o_i, s) = $time$(o_j, s') \land o_i \neq o_j$
$\Rightarrow$resources$(o_i, s) \cap $resources$(o_j, s') = \phi$ constraint (10):

$$\forall s \in \text{stages}(B):\text{enabling}(B, s) = \cap \text{enabling}(o, s_o) \neq \phi$$

$o \in B$, $s_o \in $stages$(o):$time$(B,s) = $time$(o, s_o)$

The last constraint also defines the enabling condition of a bundle at stage s; its resources at stage s are given by $$\text{resources}(B,s) = \cup \text{resources}(o,s_o)$$

$o \in B$, $s_o \in $stages$(o):$time$(B,s) = $time$(o, s_o)$

Conflict constraints between bundles

As all timing relations in a bundle are fixed, the scheduler can use a conflict model between bundles. Therefore conflict constraints are formulated that must hold for a set β of bundles to be conflict free (with c being a control step in the resulting schedule)
constraint (11):

$$\forall B_i, B_j \in \beta, \forall s \in \text{stages}(B_i), \forall s' \in \text{stages}(B_j)$$

time$(B_i,s) = $time$(B_j,s') \land B_i \neq B_j$
$\Rightarrow$resources$(B_i,s) \cap $resources$(B_j,s') = \phi$ constraint (12):

$$\forall c: \cap \text{enabling}(B,s_B) \neq \phi$$

$B \in \beta$, $s_B \in $stages$(B):c = $time$(B,s_B)$

Code selection and delayed binding

As said above, the code generator binds $G_{DFG}$ onto $G_{ISG}$ in subsequent phases. In a first phase, it is decided on which data dependencies will become direct data dependencies, or equivalently, the DFG operations are partitioned into groups, each becoming a bundle eventually.

This phase matches graph patterns in the DFG onto graph patterns in the ISG. The DFG operations are refined according to relation (1) and direct data dependencies are bound, as shown in FIG. 6(*a*) and (*b*), and according to constraints (2) to (6). The code selection tool may add some move operations to the DFG for this. The allocated data dependencies are not yet bound, but it is verified that each bundle input and output can access static storage. It is made certain that the correctness constraints for bundles, constraints (7) to (10), are not violated.

However, several binding alternatives may still be possible. In this phase only the partitioning of the DFG operations into bundles is done; the exact binding decision is delayed to a subsequent task. The design, both the DFG and the ISG, is also taken to a higher level of abstraction. For each subgraph in the DFG that is formed by the partitioning above, a new abstract operation $g \in L$ is created, and the subgraph is replaced by an instance of operation g. For each valid binding of this subgraph, a new operation $b \in V_I \subset L$ is created. Operation b is inserted in the ISG and is a subtype of operation g in the type hierarchy of L. The enabling condition(s), the resources and the timing of operation b can all be derived from the original ISG and are annotated with b.

In this way the same relations are obtained as depicted in FIG. 5, but with a DFG and an ISG of much lower complexity. Specific binding possibilities, to be decided on in a subsequent phase, are directly accessible in the library.

Register allocation

In a second phase, the (allocated) data dependencies between bundles are bound. This means that for each operation g an implementation b is chosen and move operations are added at their inputs and outputs to access static storage, while satisfying constraints (7) to (10). In addition to the simple paths considered in FIG. 6(*c*), also paths visiting more than one static storage can be needed, for example to spill a register to memory and to reload it. In the latter case, new bundles are inserted that only consist of single move operations.

Two important characteristics of the ISG model, which pattern-based models are lacking, are:

Its graph structure allows the binding problem of values to be formulated as a path-search problem.

It supports an incremental construction of the eventual instructions, by combining elementary actions (either operations or moves) into bundles. By associating resources and enabling attributes with every elementary action, and by defining how these attributes can be combined, an accurate conflict behavior is available for every partial bundle.

These two characteristics are essential for the register allocation tool, to evaluate the impact of the different routing alternatives for a single data dependence on both the global register and timing cost.

Scheduling

After register allocation, all operations and values are bound to the ISG, but they must still be bound to time. During this scheduling phase, for each operation also an instruction is chosen from its enabling condition. The objective is to minimize cycle count, thus as many operations as possible should be scheduled in parallel, while satisfying the conflict constraints (11) and (12).

3. ADDITIONAL MODELING ISSUES

Control flow operations

The basic idea behind modelling the decision making capabilities of a processor in the ISG is to introduce abstract control flow operations. Control flow operations in the ISG are much like data-path operations. They just model the control unit of the processor instead of the data path. A jump operation, for example, assigns a new value to the program counter (PC).

Other operations, such as a call to a subroutine or a hardware do loop have a more complex behavior, the details of which are not put in the ISG as they are unneeded for code generation. Instead an abstract control flow operation is inserted in the ISG and its behavioral model is stored elsewhere and made available to the simulator.

Data-path operations in a processor usually do not only generate a result, but also set flags depending on properties of the result. These flags are stored in a status register and can be used by the control flow operations to implement decision making. The generation and the consumption of these flags is modelled in the ISG, as it leads to operation dependencies which are important for code generation.

For the purpose of this description, it can be assumed that the application program is represented by a control data flow graph (CDFG), without introducing branch labels or other references to the PC. A small "C" program is shown in FIG. 7(a) together with the resulting if-then-else construct in the CDFG. The condition is obtained by subtracting value b from value a and the resulting flags are input of the less-than (LT) operation that yields a boolean value (a bit) needed by the if_expr operation. This if_expr operation selects between the then (if the boolean value is true) and the else (if the boolean value is false) paths in the CDFG, as indicated by the dashed arrows in FIG. 7(a). This CDFG can be mapped on the small ISG shown in FIG. 7(b): values a and b are respectively put in registers AX and AY, and the CDFG operations are mapped on the ISG operations with a matching label (i.e. labels consisting of the same symbol). Thus, the ISG must also contain an LT operation. The if_expr operation is refined to a conditional jump operation (CJMP) and mapped to the corresponding operation in the ISG. Together with a non-conditional jump that is added in a later compilation phase, the CJMP operation implements the selection of either the then or the else path in the if-then-else structure.

Conditionally executable instructions

A conditionally executable instruction enables some ISG operations if a certain condition is true and is otherwise equal to a NOP instruction that does not enable any operation.

A conditional construct like in FIG. 7(a) can not be executed by a conditional instruction, because also something must be done when the condition is false. FIG. 8(a) contains a similar C example and the corresponding if-then CDFG construct that can be implemented by a conditionally executable instruction. Not only the increment operation is conditional, but also the read and write operations of the operands and result(s) are conditional, and this must be modelled in the ISG. So what is needed is a way to express that an ISG operation like the LT operation enables (or disables) a group of other ISG operations. For this purpose a macro-node concept is introduced in the ISG.

A macro-node is a group of ISG operations and is enabled by the enable operation that it contains, when that enable operation receives a true as input. Other ISG operations contained in a macro-node are active if both their macro-node is enabled and their enabling condition is satisfied.

FIG. 8(b) contains a small ISG with a macro-node that is shown as a dashed rectangle. All operations drawn in the rectangle are in the macro-node.

The code generator recognizes that the pattern of FIG. 8(a) can be mapped onto either the ISG shown in FIG. 7(b) or the ISG shown in FIG. 8(b). In the latter case, the if_expr operation will be refined to an enable operation, while in the former case it would be refined to a CJMP operation.

Residual control

When the execution of an operation does not solely depend on the instructions in the instruction register but also on some bits in a mode register, that operation is said to be residually controlled. A common example in DSP processors is a saturation bit, indicating whether an adder must perform saturating or normal additions, which have a different behavior when an overflow would occur.

A residually controlled operation can be modelled by splitting it in several conditionally executable operations, as shown in the ISG of FIG. 9(a). There two operations are inserted in the ISG, the add has non-saturating behavior and the add_sat saturates. Each of them is in a macro-node with either an enable or a disable node connected to the register containing the saturate-bit. A disable node enables its macro-node when it receives a false as input.

Another way of modelling residually controlled operations is shown in the ISG of FIG. 9(b). There an ADD operation with an additional input is inserted in the ISG. Its behavior is such that it performs normal additions when the third input is 0 and performs saturated additions when the third input is 1. The add and add_sat operations are expanded by the front-end into ADD operations with the third input connected to the appropriate constant, 0 or 1. This way of modelling allows to elegantly handle the setting and clearing of the saturation bit, just like any other constant that must be present at an operation input and is therefore used in the preferred embodiment.

Data types

A storage element physically contains a bit string of a certain length, but on a typical DSP processor not all storage elements have the same bit width.

For example, most storage elements of the ADSP-2111 from Analog Devices have a word length of 16 bit, but the address registers are only 14 bit long. Sometimes the behavior of a processor operation presupposes a data type that is more specific than a bit string, such as e.g. an unsigned integer or a signed fractional number. In the ADSP-2111 from Analog Devices for example, memory addresses, contained in address registers, are supposed to be unsigned integers, while address modifiers, contained in index registers, are supposed to contain signed integers. Each storage element in the ISG is thus annotated with its specific data type, as for example the num data type in FIG. 3.

To spill a 14 bit register to a 16 bit wide memory, a conversion from 14 to 16 bit is performed while putting the register contents on the data bus. This conversion involves a zero or a sign extension, depending on the assumed data type in the register. This can be modelled in the ISG as shown in FIG. 10(a), where a path exists from the 14 bit register to the memory and back. In the latter path, from memory to register, a conversion is done to transform the 16 bit value to a 14 bit value. However, the two most significant bits are lost during this conversion, which is potentially unsafe. While mapping data dependencies on the ISG, the code generator must check on the type safety of move operations, because a move operation then also may contain data type conversions. Therefore each value must be annotated with its data type and its alignment on the storage element.

Additionally, the code generator must then know how each ISG operation possibly changes this data type or alignment.

In the preferred embodiment of the present invention, another approach is used to guarantee that only type safe data moves are generated. This approach simplifies the data type checks for the code generator, at the cost of a larger ISG. The basic principle is that the code generator will never add any move operation to the DFG that is changing a data type (i.e. all operations in $V_I^{move}$ preserve their input data type). In fact, the connectivity of the ISG is used to make abstraction of any reversible type conversion. Each storage element is annotated with a specific data type and may only carry values of that data type. If in reality a physical storage element can carry different data types, an additional storage element carrying that specific data type is inserted for each of them. Such an additional storage element is not a resource, but an alias of the physical storage element and defined by an alias relationship. The resources() function above-described will never return aliases, but always the corresponding physical storage elements, which are the ones used to check for hardware conflicts. FIG. 10(b) contains the example of FIG. 10(a) modelled in this way, where aliases and their physical storage element are put in a dashed box. For example, when a 14 bit unsigned integer must be spilled, it is spilled to a memory alias with the same data type. In case that the application requires the data type of a value to change, the DFG will contain a conversion operation for this. This operation can then be mapped onto a conversion operation with the appropriate behavior as for example the conv operation in FIG. 10(b).

Record data types Certain registers on a processor have an internal structure, they are constructed out of other registers that are also separately addressable. The accumulator register of most fixed-point DSP processors is an example of such a record storage element. In the example processor described earlier the accumulator register MR is the concatenation of the two registers MR0 and MR1.

A record storage element must have a record data type. The elements of the record data type completely match the elements of the record storage element. Indeed, the basic types of the record data type are assigned to the composing storage elements of the record storage element. Aliases can as well be defined for record storage elements as for the composing storage elements, as above-described.

The internal structure of a record storage element is captured in the ISG by a structural relationship between the storage element and its composing storage elements. This defines the storage element to be an alias of the concatenation of its composing storage elements and models the overlap of the storage elements. The advantage of defining a record storage element in this way is that it can be accessed as a whole, while it also allows to access the composing storage elements separately. For an operation that occupies a record storage element, the resources() function above-described will thus return the physical storage elements that compose the record storage element.

Functional units

Functional units in a conventional net-list model are defined as units having ports which are connected to nets. Operations are defined on these functional units, with their arguments bound to the ports. In the ISG, arguments of operations are directly bound to transitories. Functional units then are optional, they are just a set of operations that are assigned to some data path operator. The specification of functional units is particularly useful when a net-list must be derived from the ISG. In FIG. 3, two functional units can be found: alu and sh.

Specification of the ISG

In principle, a designer could directly provide the full ISG description to be used by the code generator and instruction simulator programs. Due to the amount of detail in a typical ISG, this would, however, be cumbersome. Instead, a more compact and user-friendly design entry level is provided by specifying a processor with the nML description formalism described in Fauth, Van Praet and Freericks, "Describing instruction set processors using nML", *Proc. European Design and Test Conference*, Paris, France 1995, and using the so-specified processor as a front-end to the ISG model of the present invention. Other possible front-end descriptions to the ISG model of a processor include a VHDL-description, a C-description or the netlist of said processor. In the sequel, for the purpose of teaching the present invention, the example of nML description is detailed.

Although nML contains all the information needed for code generation, it is not a processor model. It does not explicitly show the connectivity of the data-path, nor does it allow efficient look up of all operations with a certain behavior. The nML description formalism is designed to facilitate the task of describing a processor. Its grammar structure aids a human to have an overview of the performed actions in each instruction part, but cannot be efficiently used by code generation phases. Hence, the need exists for the instruction set graph with a structure fitting the graph of the application to be programmed and with the type of hierarchy which is useful for a computer program.

The nML front-end is partly based on prior art (see for example, the description concepts of nML set forth below) enhanced with new developments (see for example, the description of adding a structural skeleton to nML, set forth below) to contain all information needed to generate the complete ISG.

Basic Concepts of nML An nML description is written at the level of a programmer's manual. Therefore, most implementation details of the actual machine are hidden, but it contains all information needed for code generation. An enumeration of both the memory locations and the instruction set of the processor are the basic ingredients of an nML description.

Complex architectures may allow hundreds of legal combinations of operations and addressing modes to compose the instruction set. The size of a description can however be reduced by introducing hierarchy and by sharing similarities among a variety of instructions. In an nML description, a grammar based approach is used for that purpose. The production rules in the grammar introduce the structure of the instruction set into the processor description.

OR-rules are production rules which indicate alternative partial instructions, a different interpretation of fields in the instruction word.

AND-rules indicate the composition of orthogonal partial instructions into a bigger part, a concatenation of independently controllable fields. Also the leafs in the hierarchy are AND-rules.

Each of the strings which can be derived from the grammar symbolizes one instruction of the processor. By itself, such a string contains no useful information. All semantic aspects are held in the (predefined) attributes of the production rules. The action attribute contains the behavior of the instruction part, described in terms of the composing rules or with register transfers. The image attribute holds the values to set the instruction word fields and the syntax attribute describes the assembly language syntax.

In nML, addressing modes are defined as mode-rules having an extra value attribute. This value is an expression that results in a memory location. When a mode-rule is referenced in the action attribute of another rule, it is replaced by its value. A mode-rule can be either an AND-rule or an OR-rule.

The hierarchy introduced by the attributed grammar makes an nML description very concise, easy to write and easily maintainable. The structure in the nML description of the example processor of the present invention is shown in FIG. 11.

An nML description is typically constructed by analyzing the instruction set of the target machine proceeding top-down. For the present example, the three formats are easily reflected in the nML description by capturing the top-level classification in an OR-rule.

```
opn instruction=computemove|moveabs|ctrl
```

Either a computation with a data move in parallel, a sole data move with absolute addressing or a control-related instruction can be executed. By further zooming into the first category of instructions, two orthogonal parts are found (i.e., two parts of the instruction that can be controlled independently). This is described in an AND-rule:

```
opn computemove(c:compute,m:move)
```

The parts of the instruction that are composed with this rule are listed in the parameter list. The declaration of a parameter consists of an instantiation name and a reference to some other rule or to a data type (in case of an immediate operand). The description of each orthogonal part is encapsulated in a rule of its own. It often occurs that such a part is even referred to by more than one rule. In our example, the operand class {AX, AR, MR0, MR1 } is subsumed in an addressing mode rule:

```
mode lopd=AX|AR|MR0|MR1
```

This rule is represented by the highlighted node in FIG. 11. There are three references to this rule. One reference for opdl of alu, one for opd of shift and one for opdl of alu-shift.

For nML, the storages represent the state of the machine and an instruction can be seen as a state transition function. This information is stored in the action attribute. Its value consists of a sequence of statements. In nML, maximum possible parallelism is implicit. A statement must either be an assignment or a conditional as shown in the following two rules. (There is also an if-then-else clause).

```
opn shift(o:lopd,sh:int(3))
    action={
        AS = o; AR = AS << sh;
    }
opn alu(o1:lopd,o2:ropd,op:unsigned(2))
    action={
        switch op   //   depending on op...
        case 0: AS = o1 + o2; // ... a different...
        case 1: AS = o1 - o2; // ... operation...
        case 2: AS = o1 & o2; // ... is executed...
        case 3: AS = o1 | o2; // ... in the alu.
        end;
        AR = AS;
    }
```

The predefined operators to form expressions include the common "C" operators plus some DSP-related extensions (e.g., exponentiation, bit rotation, bit string selection and concatenation). Other operators are easily added.

The definition of an attribute can include references to attributes defined by the parameters of the rule.

```
opn computemove(c:compute,m:move)

action={c.action; m.action;}
```

The above defines the action of computemove as the sequence of the actions of the instances of compute and move.

The binary coding and the assembly language mnemonic are captured in the image resp. the syntax attribute. The value of the image attribute is a bit string, and the value of the syntax attribute is a string.

```
opn computemove(c:compute,m:move)

image="0"::c.image::m.image syntax=format("%S||%S",c.syntax,m.syntax)
```

The image attribute attached to this rule expresses that the binary code for this instruction part consists of a fixed single bit prefix "0" concatenated with the image attributes of the two components. The definition of the syntax attribute is similar. (The function format resembles the "C" library function printf).

In addition to the aforementioned opn rules, there are rules to support the description of addressing modes. These mode rules behave similar to opn rules but have an effective address expression. The parallel data moves of our example processor use indirect addressing to compute the effective address.

```
mode indinc (j:card(2),k:card(2))=m[r[j]]

action={r[j]=r[j]+i[k];} image="0"::j::k syntax=format("(R%d++I%d)",j,k)
```

This rule specifies the effective address as well as some code that is used to update the address register. It is used in contexts such as:

```
mode adrmode=indinc|inddec opn load (r:regm,a:adrmode)
``` action={r=a; a.action;} image="00"::r.image::a.image

A storage element is declared by giving a name, the size and the element type.
For example:

mem m [1024,int(16)]

reg r [4, fix (1,31)]

This defines a memory m of 1K with elements of 16 bit integer numbers and a four element register file r of 32 bit fixed-point numbers.
Adding a structural skeleton to nML The foregoing discussion of modelling hardware conflicts via transitories explained how transitories model all possible hardware conflicts in the ISG. These transitories have also been added to the nML formalism, to be able to use it as a front-end to the ISG model. A transitory is declared like a register or a memory, but with the key-word trn. An nML description starts with specifying a structural skeleton of the processor at the level desired in the ISG, with exception of most read/write ports of static storage elements (see discussion of modelling hardware conflicts via transitories). These are automatically created in the translation from nML to ISG.

Instead of complete register transfers, the action attributes now contain operations connected to the storage elements to express the behavior of a partial instruction. In this way, it is possible to specify, for example, different operations writing to the same transitory.

The operations in an nML description can be annotated with the functional unit on which they are executing, and can be attributed with timing information. By means of extra attributes to either the operations or the storage elements, it is in fact possible to express all information needed in the ISG.

For the description of memory and register read/write operations with different addressing mechanisms, the mode rules are used. However, the semantics of these mode rules have been changed for a better modelling of hardware conflicts. When a mode-rule is referenced in the action attribute of another rule, a distinction is made between two cases. The value can be evaluated as an I-value (a left-value, i.e., the definition of a location to be written) or as an r-value (a right-value, i.e., the definition of a location to be read). An r-value translates into a read operation between the involved static storage element and a transitory modelling its read port; an I-value into a write operation between the static storage element and its write port. Each value can be annotated with the read port and the write port to be used in the respective evaluations.

The refined semantics of the mode-rules make that each addressing mode needs only to be described once, while providing the precise modelling of possible hardware conflicts for both the read and write operations.
Use of the Model by the Code Generation and Instruction Set Simulation Programs All the concepts explained are implemented in a retargetable compiler which is detailed in this section. For purposes of teaching the compiler CHESS is chosen as an example of a retargetable compiler. An overview of the retargetable compiler is given in FIG. 12. A retargetable compiler needs two inputs:
1. A specification of the target processor.
2. An application program, for example written in C.

On the one hand, the processor specification consists of a description of the data types and operations that are supported in the instruction set of the processor. The processor specific data types and operations are specified in the C language.

On the other hand, the processor specification contains a description of the processor architecture and instruction set. This is specified preferably in the nML language.

It is the task of the front-end of the retargetable compiler to translate the C and nML descriptions into internal formats used by the retargetable code generator. The processor primitives of the library L are stored in the LIB format (.lib files), the architecture and instruction set description is stored as an instruction set graph or ISG (.isg files), and the non-primitive functions of the processor model and of the application program are stored in a control data flow graph or CDFG format (.cdfg files).

It is then the task of the back-end of the retargetable compiler, the retargetable code generator, to perform the code generation phases using these internal formats.

The translation of processor and program specifications into the internal models takes place in the first four steps shown in FIG. 12, after this the code generation phases are executed. All steps are explained in the following:
1. The processor specific operations are specified in the C language and this specification is translated into the LIB format by means of the noodle tool. For primitive operations (i.e. operations supported by the instruction set of the processor), only an entry in the LIB is generated; for non primitive operations, also a CDFG view is generated.
2. The processor instruction set and RT-level architecture are specified in the nML language, and are translated into an ISG by means of the animal tool. Here it is checked that only primitive operations are used in the nML actions. In the ISG, operations are attributed with connectivity and instruction encoding information.
3. The application program is specified in the C language, and the main function is translated into a main CDFG. If other functions are defined, then these are translated into a separate CDFG and a program specific library is generated for them. For this step, the noodle tool will again be used. Note that the specification file containing the processor specific operations (processor.h) is included in the application program file by means of an #include directive.
4. As a last step in the front end all non-primitive operations are expanded down to the level of primitives by means of an expansion tool cdfgexp, and the resulting CDFG is then used as the input for the code generator.
5. This is the first phase of the code generator. Some standard flow graph transformations are done by the floop tool to optimize the CDFG for later mapping on the ISG. These transformations include constant folding, strength reduction, common subexpression elimination, loop invariant code motion and reduction of induction variables.
6. The cosel tool implements the code selection phase as explained above. The several binding possibilities which are then still possible, are annotated in the LIB and ISG formats. This makes the generation of new lib and .isg files necessary.
7. The register allocation phase is performed by the amnesia tool, as also explained above.
8. The mist tool schedules the CDFG and thus binds operations to time steps, choosing an instruction for each operation from its enabling condition, see also above.
9. The CDFG is then translated to binary code by the assembly tool. This also includes the assignment of values to fields within a register file, and the generation of up until then unspecified addresses.

Steps 1 and 2 need to be executed once for every processor design iteration, the other steps need to be executed once for every change to the application program.

A simulator generator based on the ISG

The ISG model is also used as processor model in a retargetable simulator generator. In the sequel, for the purposes of teaching, the retargetable simulator generator CHECKERS is detailed. In fact the instruction level simulator can be an executable C++ program that is automatically generated by analyzing the ISG. The flow of this process is shown in FIG. 13. The first two steps are completely the same as for the retargetable compiler. In a third step the ISG is analyzed by the tool checkers to generate the C++ program. This tool topologically sorts the operations in the ISG according to their connections and optimizes the enabling conditions so they can be evaluated fast. The C++ program basically is a list of calls to the functions containing the behavioral models of the ISG operations, with each call being guarded by the corresponding enabling condition. The functions containing the behavioral models are described in the processor.c file. The last step to build the simulator is to compile the C++ program together with the processor.c file with a C++ compiler. This yields the instruction set simulator.

In the preferred embodiment, the resulting instruction level simulator interprets a stream of non-preprocessed instructions to simulate the behavior of processor. It is also possible to input this instruction stream to the simulator generator in which case the resulting C++ program would contain a behavioral model of the processor for the given instruction stream.

Implementation of the ISG

In this Section, the implementation of the preferred embodiment of the ISG is explained. The flowdiagram of the program that performs the translation from nML to ISG is shown in FIG. 14. The objects that make up the embodiment of the ISG and the relationships between these objects are captured in the information structure diagram shown in FIG. 15.

Objects of the instruction set graph

The ISG object represents the instruction set graph.

The ISGoperation object represents an element of the set $V_I$, and all the properties of such an element. These properties are for example the type of operation and the enabling condition of the operation.

The Storage object represents an element of the set $V_S$, and all the properties of such an element. These properties are for example the capacity of the storage and the data type of the values that the storage can hold.

A storage object can be any one of the following three subtypes:

A Memory object, representing a static storage element, usually with a large capacity and for which the access operations take relatively long.

A Register object, representing a static storage element, usually with a small capacity and for which the access operations take much less than a machine cycle.

A Transitory object, representing a transitory storage element.

This supertype/subtype relationship is indicated by the thick line in FIG. 15.

The ISGoperator object represents a functional unit.

Relationships between the objects of the instruction set graph

An ISG contains zero or more Memorys, as indicated by the memories relationship; a Memory belongs to exactly one ISG, as indicated by the isg relationship.

An ISG contains zero or more Registers, as indicated by the registers relationship; a Register belongs to exactly one ISG, as indicated by the isg relationship.

An ISG contains zero or more Transitorys, as indicated by the transitories relationship; a Transitory belongs to exactly one ISG, as indicated by the isg relationship.

An ISG contains zero or more ISGoperations, as indicated by the operations relationship; a ISGoperation belongs to exactly one ISG, as indicated by the isg relationship.

An ISG contains zero or more ISGoperators, as indicated by the operators relationship; a ISGoperator belongs to exactly one ISG, as indicated by the isg relationship.

A Storage has zero or more ISGoperations that read from it, as indicated by the read operations relationship; a ISGoperation has zero or more Storages it reads from, as indicated by the inputs relationship.

A Storage has zero or more ISGoperations that write to it, as indicated by the write operations relationship; a ISGoperation has zero or more Storages it writes to, as indicated by the outputs relationship.

A Storage can be the child alias of zero or one other Storage, as indicated by the alias of relationship; a Storage can be the parent alias of zero or more other Storages, as indicated by the aliases relationship.

An ISGoperator can be the functional unit on which zero or more ISGoperations are defined; as indicated by the operations relationship; an ISGoperation can be defined on zero or one ISGoperators, as indicated by the functional unit relationship.

What is claimed is:

1. A method of generating code for a programmable processor being implemented in hardware and having an instruction set, said method comprising the steps of;

representing said processor as a directed bipartite graph with first and second sets of vertices and with edges, said graph comprising essentially all information about the instruction set and the hardware of said processor, said first set of vertices representing storage elements in said processor, and said second set of vertices representing micro-operations in said processor, linking said graph to tools and libraries required for generating code for said processor, and executing the required code generation phases whereby the required information about said processor is extracted from said graph.

2. The method as defined in claim 1 wherein, said edges represent valid connections between said micro-operations and said storage elements, said connections modeling the data flow in said processor.

3. The method as defined in claim 1 wherein said code generator evaluates the optimization space of generating code for an application algorithm, further comprising the step of building a decision tree with vertices and branches wherein:

vertices of said decision tree represent primitive operations, whereby said application algorithm contains instances of said primitive operations;

said branches represent possible transformations of said primitive operations according to alternative mapping possibilities in said optimization space, and wherein, the set of vertices of said decision tree comprises vertices representing patterns of other vertices of said set, said patterns being defined during said code generation phases, and the second set of vertices representing micro-operations of said processor.

4. The method as defined in claim 1, further comprising the steps of:

representing hardware conflicts in said processor as access conflicts on said vertices representing said storage elements; and annotating each vertex of said second set of vertices representing micro-operations with an enabling condition, said enabling condition representing values of the instruction register of said processor that enable the execution of the micro-operation represented by said vertex.

5. The method as defined in claim 4 wherein, said method determines valid partial instructions, said method further comprising the steps of:

selecting a subset of said second set of vertices representing micro-operations;

verifying that the intersection of the enabling conditions of all micro-operations of said subset is not empty; and verifying that said subset is free of access conflicts on said storage elements.

6. The method as defined in claim 1 wherein, said storage elements are static and transitory storage elements, said method further comprising the step of representing all hardware conflicts in said processor as access conflicts on said vertices representing said transitory storage elements.

7. The method as defined in claim 1 wherein, data-types supported by a storage element are specified, said method further comprising the steps of:

specifying different vertices representing one storage element;

annotating each of said different vertices with a data type supported by said one storage element, and specifying an alias relationship between said different vertices representing said one storage element.

8. The method as defined in claim 1 adapted for representing record storage elements, said method further comprising the steps of:

specifying a vertex representing the concatenation of several storage elements;

annotating said vertex with a data type being a record of the data types of said storage elements;

specifying a structural relationship between said vertex and the vertices representing said storage elements.

9. The method as defined in claim 1, adapted for representing micro-operations of which the execution depends on a defined condition, said method further comprising the steps of:

specifying a subset of said second set of vertices representing micro-operations, characterized in that all vertices in said subset depend on said condition;

specifying in said subset a vertex;

specifying an edge of said edges, said edge connecting a vertex of said first set of vertices that represents the storage element where said condition is available with said vertex in said subset, and said edge indicating that said micro-operations represented in said subset can only be enabled when said condition has a specific value.

10. The method as defined in claim 4 wherein, execution times of micro-operations are modeled, said method further comprising the steps of:

annotating an enabling condition of said micro-operation with the relative time step of the corresponding instruction issue with respect to the start of said micro-operation;

annotating said operation with the time steps relative to the start of said micro-operation at which said operation accesses the input and output storage elements of said micro-operation.

11. The method as defined in claim 1 wherein, said method represents a functional unit in said processor, said method further comprising the steps of specifying a subset of said second set of vertices representing operations wherein, all vertices in said subset execute on said functional unit.

12. The method as defined in claim 1 wherein, said processor includes a controller unit, and micro-operations modeling said controller unit are represented as vertices of said second set of vertices representing micro-operations.

13. The method as defined in claim 1 wherein, said processor has an architecture and instruction set designed for a specific class of algorithms such as digital signal processing algorithms.

14. The method as defined in claim 13 wherein, said processor is integrated in an application-specific integrated circuit.

15. A retargetable code generator for generating code for programmable processors being embedded in an electronic system comprising:

an electronic system with an embedded programmable processor, first tools to build a directed bipartite graph with vertices and edges which internally represents said programmable processor, said graph comprising essentially all information about the instruction set and the hardware of said processor and having first and second sets of vertices, said first set of vertices representing storage elements in said processor, and said second set of vertices representing micro-operations in said processor, said edges represent valid connections between said micro-operations and said storage elements, second tools and libraries required to generate code for said processor, and means to link said graph to said second tools and said libraries, whereby the information about said processor required during code generation is extracted from said graph.

16. A retargetable code generator as defined in claim 15 wherein said first tools:

represent hardware conflicts in said processor as access conflicts on said vertices representing said storage elements; and annotate each vertex of said second set of vertices representing micro-operations with their enabling condition, said enabling condition representing values of the instruction register of said processor that enable the execution of the operation represented by said vertex.

17. A retargetable code generator as defined in claim 16 wherein said second tools determine valid partial instructions by;

selecting a subset of said second set of vertices representing micro-operations;

verifying that the intersection of the enabling conditions of all micro-operations of said subset is not empty; and verifying that said subset is free of access conflicts on said storage elements.

18. A method of simulating the execution of code on a programmable processor, being implemented in hardware and having an instruction set, said method comprising the steps of:

representing said processor as a directed bipartite graph with first and second sets of vertices and with edges, said graph comprising essentially all information about the instruction set and the hardware of said processor, said first set of vertices representing storage elements in said processor, said second set of vertices representing micro-operations in said processor;

said edges representing valid connections between micro-operations and said storage elements, and said connections modeling the data flow in said processor, linking said graph to tools and libraries required for said simulation, and executing said simulation whereby the required information about said processor is extracted from said graph.

19. The method as defined in claim 18 further comprising the step of representing hardware conflicts in said processor as access conflicts on said vertices representing storage elements.

20. The method as defined in claim 18 wherein, said storage elements are static and transitory storage elements and wherein all hardware conflicts in said processor are represented as access conflicts on said vertices representing said transitory storage elements.

21. The method as defined in claim 18 wherein, each vertex of said second set of vertices representing s is annotated wit an enabling condition, said enabling condition representing values of the instruction register of said processor that enable the execution of the micro-operation represented by said vertex.

22. The method as defined in claim 18 wherein data-types supported by a storage element are specified, said method further comprising the steps of:

specifying different vertices representing one storage element;

annotating each of said different vertices with a data type supported by said one storage element, and specifying an alias relationship between said different vertices representing said one storage element.

23. The method as defined in claim 18 adapted for representing record storage elements, said method further comprising the steps of:

specifying a vertex representing the concatenation of several storage elements;

annotating said vertex with a data type being a record of the data types of said storage elements;

specifying a structural relationship between said vertex and the vertices representing said storage elements.

24. The method as defined in claim 18 adapted for representing micro-operations of which the execution depends on a defined condition, said method further comprising the steps of:

specifying a subset of said second set of vertices representing micro-operations, characterized in that all vertices in said subset depend on said condition;

specifying in said subset a vertex;

specifying an edge of said edges, said edge connecting a vertex of said first set of vertices that represents the storage element where said condition is available with said vertex in said subset, and said edge indicating that said micro-operations represented in said subset can only be enabled when said condition bas a specific value.

25. The method as defined in claim 18 wherein, the execution times of micro-operations are modeled, said method further comprising the steps of:

annotating an enabling condition of said micro-operation with the relative time step of the corresponding instruction issue with respect to the start of said operation;

annotating said micro-operation with the time steps relative to the start of said micro-operation at which said micro-operation accesses the input and output storage elements of said micro-operation.

26. The method as defined in claim 18 wherein, said method represents a functional unit in said processor, said method further comprising the step of specifying a subset of said second set of vertices representing micro-operations characterized in that all vertices in said subset execute on said functional unit.

27. The method as defined in claim 18 wherein said processor includes a controller unit, and said controller unit are represented as vertices of said second set of vertices representing micro-operations.

28. A retargetable simulator that performs the simulation of the execution of code on a programmable processor being embedded in an electronic system comprising:

an electronic system with an embedded programmable processor, first tools to build a directed bipartite graph which internally represents said programmable processor with first and second sets of vertices and with edges, said graph comprising essentially all information about the instruction set and the hardware of said processor, said first set of vertices representing storage elements in said processor, and said second set of vertices representing operations in said processor;

second tools and libraries required for simulating said processor, and means to link said graph to said second tools and libraries whereby the information about said processor required during simulation is extracted from said graph.

29. A method of synthesizing a programmable processor being implemented in hardware, comprising the steps of:

representing said processor as a directed bipartite graph with first and second sets of vertices and with edges, said graph comprising essentially all information about the instruction set and the hardware of said processor, said first set of vertices representing storage elements in said processor;

said second set of vertices representing micro-operations in said processor;

said edges representing valid connections between said micro-operations and said storage elements, said connections modeling the data flow in said processor;

linking said graph to tools and libraries required for generating a netlist of hardware building blocks;

implementing said processor as a hardware device according to said netlist.

30. A method of modeling a programmable processor being implemented in hardware adapted for use in an automatic retargetable code generator and in an instruction set simulator, said method comprising the steps of:

identifying storage elements and micro-operations in said processor; and representing said processor as a directed bipartite graph with first and second sets of vertices and with edges, said graph comprising essentially all information about the instruction set and the hardware of said processor, said first set of vertices representing storage elements in said processor, and said second set of vertices representing operations in said processor.

31. The method as defined in claim 30, wherein said edges represent valid connections between said micro-operations and said storage elements, said connections modeling the data flow in said processor.

32. The method as defined in claim 30, further comprising the step of constructing said graph, said constructing step including the further steps of:

parsing a textual specification of said processor described in a high-level language; and transforming said parsed textual specification into said graph.

33. The method as defined in claim 32, wherein said high-level language is an nML processor description language.

34. The method as defined in claim 30, wherein each vertex of said second set of vertices representing -operations is annotated with an enabling condition, said enabling condition representing values of the instruction register of said processor that enable the execution of the micro-operation represented by said vertex.

35. The method as defined in claim 30, further comprising the step of representing hardware conflicts in said processor as access conflicts on said vertices representing storage elements.

36. The method as defined in claim 30, wherein said storage elements are static and transitory storage elements, said method further comprising the step of representing all hardware conflicts in said processor as access conflicts on said vertices representing said transitory storage elements.

37. The method as defined in claim 30, wherein data types supported by a storage element are specified, said method further comprising the steps of:

specifying different vertices representing one storage element;

annotating each of said different vertices with a data type supported by said one storage element; and specifying an alias relationship between said different vertices representing said storage element.

38. The method as defined in claim 30, adapted for representing record storage elements, said method further comprising the steps of:

specifying a vertex representing the concatenation of several storage elements;

annotating said vertex with a data type being a record of the data types of said storage elements; and specifying a structural relationship between said vertex and the vertices representing said storage elements.

39. The method as defined in claim 30, adapted for representing micro-operations of which the execution depends on a defined condition, said method further comprising the steps of:

specifying a subset of said second set of vertices representing micro-operations, characterized in that all vertices in said subset depend on said condition;

specifying in said subset a vertex;

specifying an edge of said edges, said edge connecting a vertex of said first set of vertices that represents the storage element where said condition is available with said vertex in said subset, and said edge indicating that said micro-operations represented in said subset can only be enabled when said condition has a specific value.

40. The method as defined in claim 30, wherein execution times of micro-operations are modeled, said method further comprising the steps of annotating an enabling condition of said micro-operation with the relative time step of the corresponding instruction issue with respect to the start of said micro-operation; and annotating said micro-operation with the time steps relative to the start of said micro-operation at which said micro-operation accesses the input and output storage elements of said micro-operation.

41. The method as defined in claim 30, wherein said method represents a functional unit in said processor, said method further comprising the steps of specifying a subset of said second set of vertices representing micro-operations, wherein all vertices in said subset execute on said functional unit.

42. The method as defined in claim 30, wherein said processor includes a controller unit, and micro -operations modeling said controller unit are represented as vertices of said second set of vertices representing micro-operations.

43. The method as defined in claim 30, wherein said processor has an architecture and instruction set designed for a specific class of algorithms such as digital signal processing algorithms.

44. The method as defined in claim 30, wherein said processor is integrated in an application-specific integrated circuit.

* * * * *